US012748353B2

(12) United States Patent
Chen et al.

(10) Patent No.: US 12,748,353 B2
(45) **Date of Patent: *Sep. 29, 2026**

(54) SYSTEM AND METHOD FOR MONITORING AND CONTROLLING EXTREME ULTRAVIOLET PHOTOLITHOGRAPHY PROCESSES

(71) Applicant: Taiwan Semiconductor Manufacturing Co., Ltd., Hsinchu (TW)

(72) Inventors: Tai-Yu Chen, Hsinchu (TW); Heng-Hsin Liu, Hsinchu (TW); Li-Jui Chen, Hsinchu (TW); Shang-Chieh Chien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 84 days.

This patent is subject to a terminal disclaimer.

(21) Appl. No.: 18/781,567

(22) Filed: Jul. 23, 2024

(65) Prior Publication Data

US 2024/0377752 A1 Nov. 14, 2024

Related U.S. Application Data

(63) Continuation of application No. 17/150,685, filed on Jan. 15, 2021, now Pat. No. 12,085,860.

(51) Int. Cl.

| | |
|---|---|
| ***G03F 7/00*** | (2006.01) |
| ***H05G 2/00*** | (2006.01) |

(52) U.S. Cl.

CPC ........ *G03F 7/70033* (2013.01); *G03F 7/7055* (2013.01); *G03F 7/7085* (2013.01); (Continued)

(58) Field of Classification Search

CPC ............... G03F 7/7085; G03F 7/70858; G03F 7/70866; G03F 7/70883; G03F 7/70908–70941; G03F 7/70975; G03F 7/70991; G03F 7/70033; G03F 7/7055; G03F 7/70; G03F 7/70025; G03F 7/70483–70575; G03F 7/70591; G03F 7/708; G03F 7/70808; G03F 7/70841; G03F 7/70916; G21K 1/065; H05G 2/005; H05G 2/008; H05G 2/003; H05G 2/00–0094; H05G 2/0027; H05G 2/0035; H05G 2/0084; H05G 2/009; H05H 1/0081; H05H 1/24;

(Continued)

(56) References Cited

U.S. PATENT DOCUMENTS

| | | | | |
|---|---|---|---|---|
| 12,085,860 | B2 * | 9/2024 | Chen ................... | G03F 7/70033 |
| 2007/0143032 | A1 * | 6/2007 | Wieringa ............... | G01N 31/22 702/24 |

(Continued)

*Primary Examiner* — Christina A Riddle

(74) *Attorney, Agent, or Firm* — Seed IP Law Group

(57) ABSTRACT

A photolithography system utilizes tin droplets to generate extreme ultraviolet radiation for photolithography. The photolithography system irradiates the droplets with a laser. The droplets become a plasma and emit extreme ultraviolet radiation. An array of sensors sense the extreme ultraviolet radiation and charged particles emitted by the droplets. A control system analyses sensor signals from the sensors and adjusts plasma generation parameters responsive to the sensor signals.

20 Claims, 11 Drawing Sheets

(52) U.S. Cl.
CPC ....... *G03F 7/70916* (2013.01); *H05G 2/0027* (2024.08); *H05G 2/0084* (2024.08)

(58) Field of Classification Search
CPC ........ G01J 1/429; G01J 1/0448; G01J 1/4257; G01J 3/10; G01J 3/4412
USPC ..... 355/30, 52–55, 67–77; 250/492.1, 492.2, 250/492, 22, 492.23, 493.1, 504 R, 505.1, 250/526
See application file for complete search history.

(56) References Cited

U.S. PATENT DOCUMENTS

| | | | | |
|---|---|---|---|---|
| 2008/0087840 | A1* | 4/2008 | Ueno | B82Y 10/00 250/504 R |
| 2011/0211179 | A1* | 9/2011 | Kraus | G03F 7/70983 355/30 |
| 2011/0284775 | A1* | 11/2011 | Ueno | G03F 7/70916 250/493.1 |
| 2017/0280545 | A1 | 9/2017 | Tomita et al. | |
| 2021/0349396 | A1* | 11/2021 | Chen | G03F 7/70175 |
| 2023/0063156 | A1* | 3/2023 | Albright | G03F 7/70033 |

* cited by examiner

SYSTEM AND METHOD FOR MONITORING AND CONTROLLING EXTREME ULTRAVIOLET PHOTOLITHOGRAPHY PROCESSES

BACKGROUND

Technical Field

The present disclosure relates to the field of photolithography. The present disclosure relates more particularly to extreme ultraviolet photolithography.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features on an integrated circuit die are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet light is used to produce particularly small features due to the relatively short wavelength of extreme ultraviolet light. For example, extreme ultraviolet light is typically produced by irradiating droplets of selected materials with a laser beam. The energy from the laser beam causes the droplets to enter a plasma state. In the plasma state, the droplets emit extreme ultraviolet light. The extreme ultraviolet light travels toward a collector with an elliptical or parabolic surface. The collector reflects the extreme ultraviolet light to a scanner. The scanner illuminates the target with the extreme ultraviolet light via a mask.

DETAILED DESCRIPTION

Figure 1:
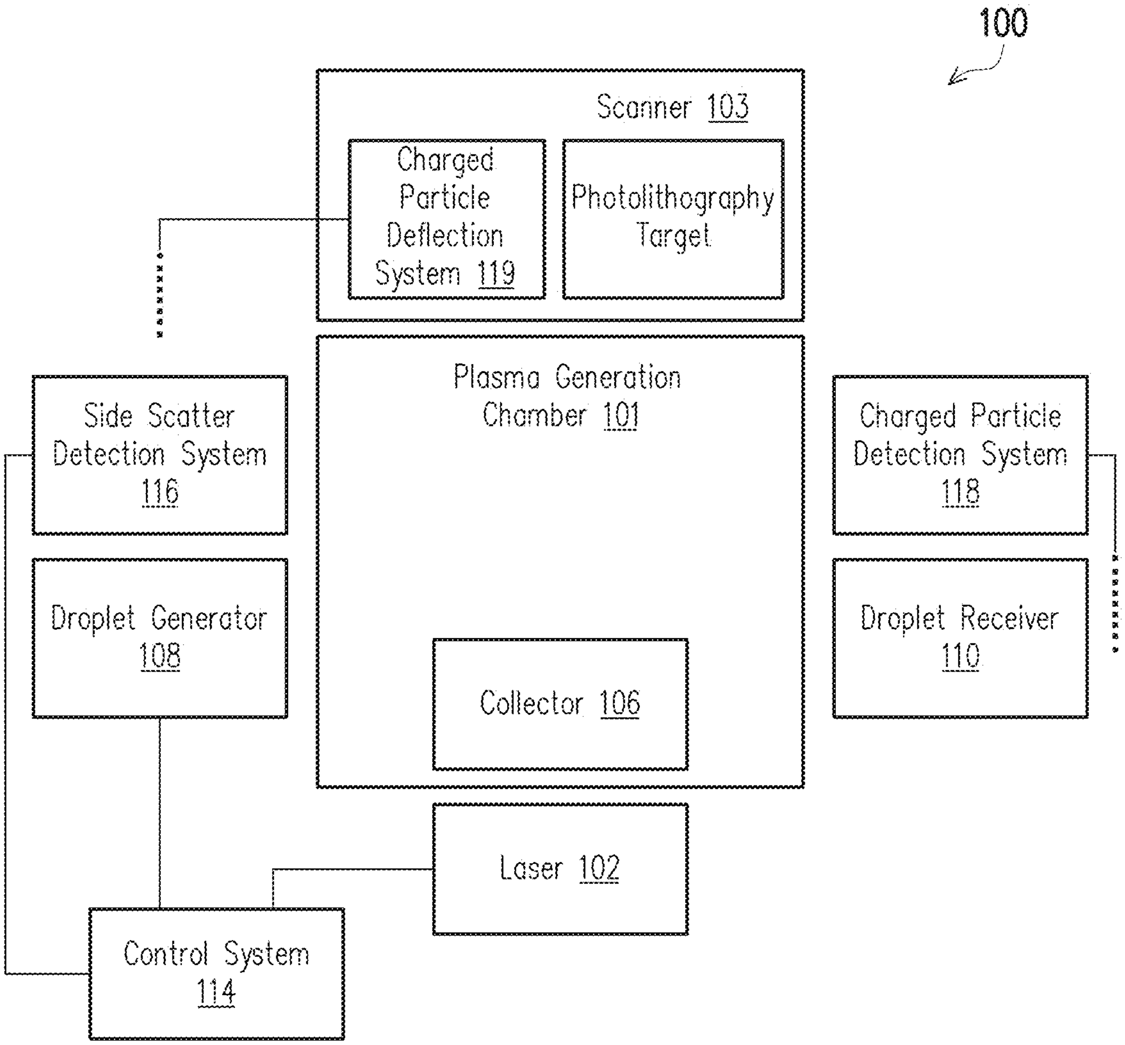
FIG. 1 is a block diagram of a photolithography system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to extreme ultraviolet radiation photolithography systems. Embodiments of the present disclosure dynamically adjust plasma generation properties based on various sensors and machine learning processes. Embodiments of the present disclosure also deflect charged particles from damaging sensitive components of the photolithography system. Accordingly, embodiments of the present disclosure reduce damage to expensive photolithography components including photolithography masks, optical systems, and semiconductor wafers. Additionally, embodiments of the present disclosure improve the efficiency of generation of extreme ultraviolet light by dynamically adjusting parameters of the photolithography system responsive to the sensor signals.

FIG. 1 is a block diagram of a photolithography system 100 in accordance with one embodiment. The photolithography system 100 includes a plasma generation chamber 101 and a scanner 103. Extreme ultraviolet light is generated in the plasma generation chamber 101. The extreme ultraviolet light is passed from the plasma generation chamber 101 to the scanner 103. The extreme ultraviolet light irradiates a photolithography target 104 in the scanner 103 via a mask.

In one embodiment, the photolithography system 100 is a laser produced plasma (LPP) extreme ultraviolet radiation photolithography system. The photolithography system 100 includes a laser 102, a collector 106, a droplet generator 108, and a droplet receiver 110. The laser 102, the collector 106, and the droplet generator 108 cooperate to generate extreme ultraviolet radiation within the plasma generation chamber 101.

The droplet generator 108 generates and outputs a stream of droplets. The droplets can include, in one example, liquid (melted) tin. Other materials can be used for the droplets without departing from the scope of the present disclosure. The droplets move at a high rate of speed toward the droplet receiver 110. The photolithography system 100 utilizes the droplets to degenerate extreme ultraviolet light for photolithography processes. Extreme ultraviolet light typically corresponds to light with wavelengths between 1 nm and 125 nm.

The laser 102 outputs a laser beam. The laser beam is focused on a point through which the droplets pass on their way from the droplet generator 108 to the droplet receiver 110. In particular, the laser 102 outputs laser pulses. Each laser pulse is timed to irradiate a droplet. When the droplet receives the laser pulse, the energy from the laser pulse generates a high-energy plasma from the droplet. The high-energy plasma outputs extreme ultraviolet radiation.

In an embodiment in which the droplets are tin droplets, the extreme ultraviolet radiation has a central wavelength of about 13.5 nm. This is because tin atoms in the plasma state release electromagnetic radiation with a characteristic wavelength of about 13.5 nm. Extreme ultraviolet radiation having wavelengths other than 13.5 nm can be utilized without departing from the scope of the present disclosure.

In one embodiment, the radiation output by the plasma scatters randomly in many directions. The photolithography system 100 utilizes the collector 106 to collect the scattered extreme ultraviolet radiation from the plasma droplets and reflects the extreme ultraviolet radiation toward the scanner 103. The scanner 103 directs the extreme ultraviolet radiation toward the photolithography target 104.

In one embodiment, the collector 106 includes an aperture. The laser pulses from the laser 102 pass through the aperture toward the stream of droplets. This enables the collector 106 to be positioned between the laser 102 and the photolithography target 104.

After the droplets have been irradiated by the laser 102, the droplets continue with a trajectory toward the droplet receiver 110. The droplet receiver 110 receives the droplets in a droplet pool. The droplets can be drained from the droplet pool and reused or disposed of.

Extreme ultraviolet radiation photolithography systems face many challenges. For example, after the droplets have been irradiated with the laser 102 and changed into a plasma, many charged particles scatter about the plasma generation chamber 101. The charged particles can include ions and free electrons. This is because when the droplets are converted to a plasma, the atoms in the droplets become ionized and many free electrons are generated. Accordingly, the plasmatized droplets include a sort of fluid (a plasma) of charged particles including ions and free electrons.

Some of the charged particles released from the plasma may travel toward the scanner 103. The charged particles can damage components in the scanner 103. The scanner 103 can include highly sensitive precision optics such as lenses and mirrors. The scanner 103 also includes the photolithography mask defining the pattern to be imprinted on the photolithography target 104. Typically, the photolithography target 104 is a semiconductor wafer. The charged particles can damage any of these components. Damage to the mask or any of the other optics can result in nonfunctioning semiconductor wafers that must be scrapped, at great expense. Additionally, if the mask is damaged by charged particles, it can cost millions of dollars to repair or replace the mask. Accordingly, it is desirable to ensure that charged particles from the plasma do not damage components within the scanner 103. As used herein, the term "charged particles" includes, but is not limited to, electrons, protons, and ions.

Another challenge faced by extreme ultraviolet photolithography systems is that it can be extremely difficult to fine-tune the parameters of plasma generation in order to generate sufficient extreme ultraviolet radiation. Parameters to fine-tune can include droplet speed, droplet size, laser pulse timing, laser pulse power, droplet preconditioning, and other parameters that contribute to the generation of extreme ultraviolet radiation. It can be very difficult to determine whether plasma generation is currently at a satisfactory level of effectiveness and efficiency. If plasma generation is not at a currently satisfactory level of effectiveness and efficiency, it can be very difficult to determine what parameters to adjust.

In one embodiment, the extreme ultraviolet light photolithography system 100 includes a control system 114 and one or more of a side scatter detection system 116, a charged particle detection system 118, and a charged particle deflection system 119. The side scatter detection system 116 and the charged particle detection system 118 assist in monitoring the current effectiveness of the plasma generation process. The charged particle detection system 118 detects parameters of charged particles emitted from the plasma. The charged particle deflection system 119 helps to protect sensitive components of the scanner 103. The control system 114 adjusts parameters of the plasma generation process responsive to the side scatter detection system 116 and the charged particle detection system 118.

In one embodiment, the side scatter detection system 116 detects a current level of intensity of extreme ultraviolet light being generated in the plasma generation chamber 101. In particular, the side scatter detection system 116 detects extreme ultraviolet light that is emitted with a substantially lateral trajectory. The side scatter detection system 116 can detect refracted light, reflected light, diffracted light, and scattered light.

The total intensity of extreme ultraviolet light emitted by plasma can be estimated or calculated based on the amount of light received by the side scatter detection system 116. On average, the plasma will emit extreme ultraviolet light at the same rate in all directions, or with known relationships between various scattering directions. Accordingly, the total intensity of extreme ultraviolet light can be estimated or calculated based on the light received by the side scatter detection system 116.

In one embodiment, the extreme ultraviolet side scatter detection system 116 provides sensor signals to the control system 114. The sensor signals indicative of intensity of light on the light sensors. The control system 114 receives the sensor signals and can adjust parameters of the photolithography system 100 responsive to the sensor signals.

In one embodiment, the control system 114 adjusts parameters of the photolithography system 100 in order to more effectively generate extreme ultraviolet radiation. The control system 114 can adjust one or more of droplet speed, droplet size, laser pulse power, laser pulse timing, laser pulse profile, initial droplet temperature, pressure within the plasma generation chamber, or other parameters.

In one embodiment, the photolithography system 100 utilizes the charged particle detection system 118 to detect charged particles ejected from the plasma. As described previously, the process of generating the plasma results in the generation of charged particles in the droplets. Some of the charged particles may be ejected from or may otherwise travel away from the droplets. The characteristics of the charged particles ejected from the plasma are indicative of characteristics of the plasma itself. The characteristics of the charged particles can include the velocity of the charged particles, the energy of the charged particles, the trajectory of the charged particles, the number of charged particles emitted per droplet, and other characteristics. Accordingly, the charged particle detection system 118 detects the charged particles and generates sensor signals indicative of parameters of the charged particles. The charged particle detection system 118 passes the sensor signals to the control system 114.

In one embodiment, the charged particle detection system 118 includes an array of charged particle detectors positioned within the plasma generation chamber 101. The charged particle detectors can be positioned to detect a variety of charged particle trajectories within the plasma generation chamber 101. In other words, the charged particle detectors can be positioned in various locations throughout the plasma generation chamber 101. Each of the charged particle detectors detects impacts of charged particles against the charged particle detectors. The charged particle detectors pass sensor signals indicative of characteristics of the charged particles to the control system 114.

In one embodiment, the control system 114 can adjust parameters of the photolithography system 100 responsive to the sensor signals from the charged particle detectors. The control system 114 can adjust the same sorts of parameters of the photolithography system 100 as those described previously in relation to the side scatter detection system 116. The control system 114 can adjust the parameters of the photolithography system in order to more effectively generate extreme ultraviolet radiation for performing photolithography.

In one embodiment, the control system 114 adjusts parameters of the photolithography system 100 responsive to sensor signals from the side scatter detection system 116 and charged particle detection system 118.

In one embodiment, the charged particle deflection system 119 is positioned within the scanner 103. The charged particle deflection system is configured to protect sensitive equipment within the scanner 103 from being damaged by charged particles entering the scanner 103 from the plasma generation chamber 101. In particular, some charged particles from the plasma may pass from the plasma generation chamber 101 through the intermediate focus aperture into the scanner 103. If the charged particles impact the mask or other sensitive components within the scanner 103, then the photolithography system or process may be heavily damaged. Accordingly, the charged particle deflection system 119 protects the sensitive components of the scanner 103 by deflecting charged particles away from the sensitive components of the scanner 103.

In one embodiment, the charged particle deflection system 119 includes one or more deflectors that generate a magnetic field in a vicinity between the intermediate focus aperture 120 and sensitive equipment of the scanner 103. As the charged particles travel through the magnetic field generated by the deflector, the trajectory of the charged particles is adjusted due to the forces that act upon charged particles traveling through magnetic field. The direction of the magnetic field is selected to cause charged particles that have an initial trajectory toward sensitive components within the scanner 103 to divert to a harmless trajectory. The charged particles can then be collected or captured, thereby preventing damage to sensitive components within the scanner 103. Alternatively, the charged particle deflection system 119 can utilize electric fields, or a combination of electric and magnetic fields to deflect charged particles.

In one embodiment, the photolithography system 100 can collect plasma information and scattering light by introducing monitoring systems and control systems. By recording plasma detail information, the photolithography system can also rebuild a 3D image through machine learning or artificial intelligence system calculation, which gives the ability to provide advanced control in light energy management and provide more plasma information for analysis. The photolithography system 100 help to research issues like ionization rate, conversion efficiency, dynamic time-resolved plasma density distribution, tin debris mitigation, tin to scanner mitigation, collector lifetime control, and can also provide a possible way to diagnose a tin to scanner orifice mechanism.

Figure 2A:
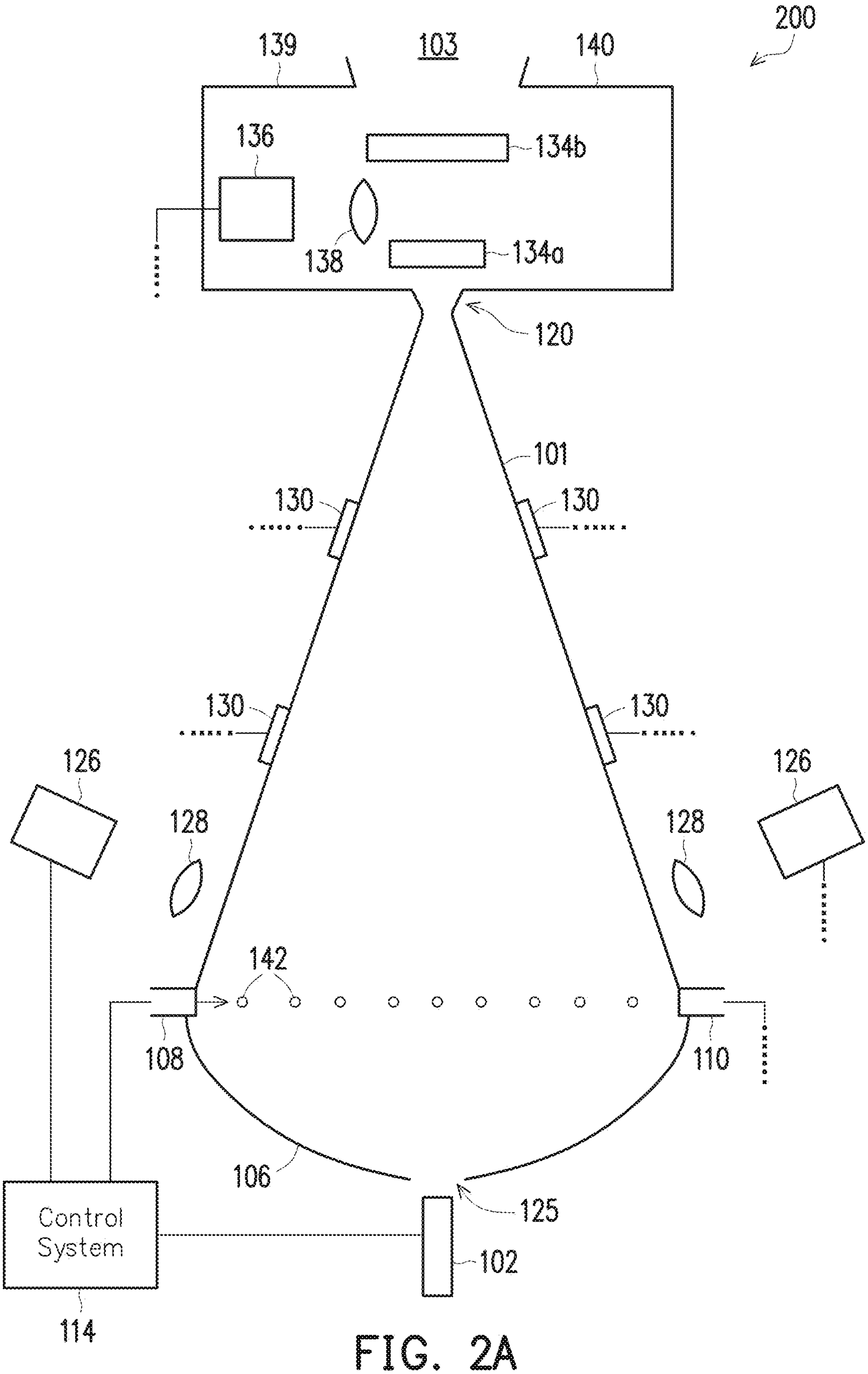
FIGS. 2A-2C are illustrations of a photolithography system, according to one embodiment.
Figure 2B:
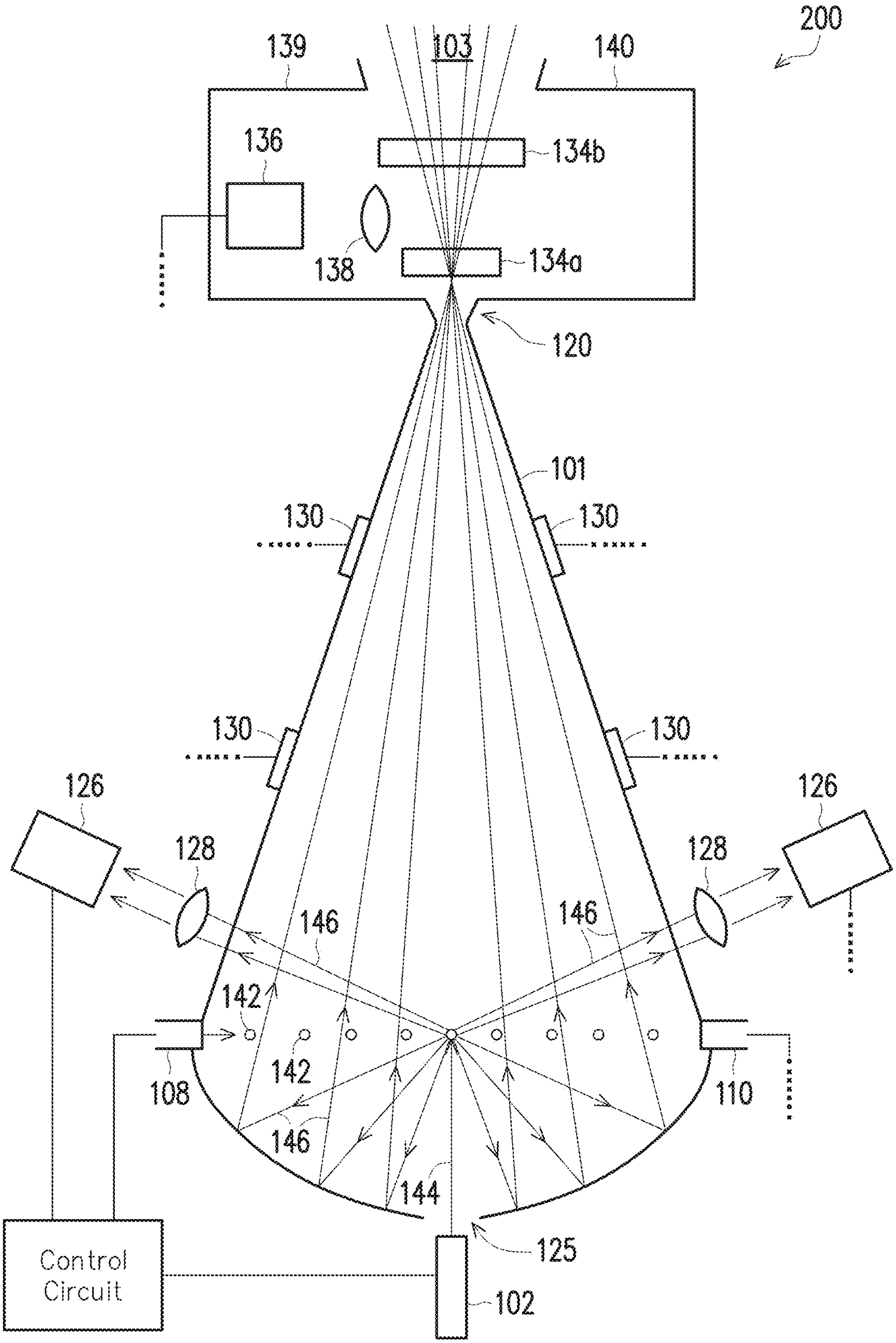
Figure 2C:
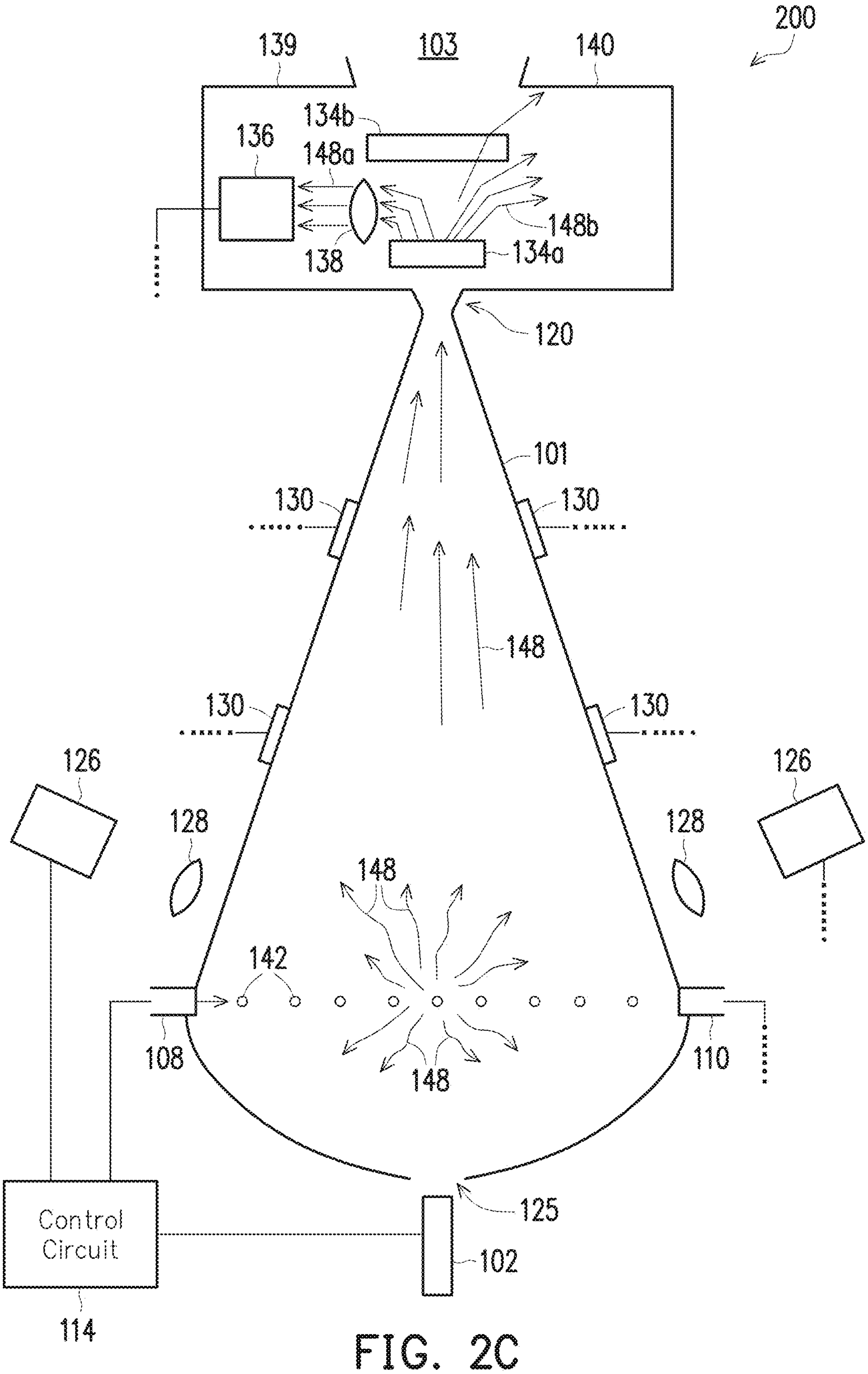

FIGS. 2A-2C are illustrations of a photolithography system 200, according to an embodiment. The photolithography system 200 is an extreme ultraviolet photolithography system that generates extreme ultraviolet radiation by laser plasma interaction. The plasma can be generated in a substantially similar manner as described in relation to FIG. 1. FIG. 2A illustrates the photolithography system prior to generating plasma and extreme ultraviolet radiation. FIGS. 2B and 2C illustrate the photolithography system 200 during generation of plasma in the extreme ultraviolet radiation. FIG. 2B illustrates extreme ultraviolet radiation emitted from plasmatized droplets. FIG. 2C illustrates charged particles emitted from the plasmatized droplets. In practice, the extreme ultraviolet radiation and the charged particles are present simultaneously. However, for illustrative purposes, the extreme ultraviolet radiation is shown only in FIG. 2B, while the charged particles are shown only in FIG. 2C.

With reference to FIG. 2A, the photolithography system 200 includes a plasma generation chamber 101, laser 102, a scanner 103, a collector 106, a droplet generator 108, and a droplet receiver 110. These components of the photolithography system 200 cooperate together to generate extreme ultraviolet radiation and to perform photolithography processes with the extreme ultraviolet radiation.

The droplet generator 108 generates and outputs a stream of droplets 142. The droplets can include, as described previously, tin, the droplets of other material can be utilized without departing from the scope of the present disclosure. The droplets 142 move at a high rate of speed toward the droplet receiver 110.

In one embodiment, the droplet generator 108 generates between 40,000 and 100,000 droplets per second. The droplets 142 have an initial velocity of between 60 m/s to 200 m/s. The droplets have a diameter between 10 μm and 200 μm. The droplet generator 108 can generate different numbers of droplets per second than described above without departing from the scope of the present disclosure. The droplet generator 108 can also generate droplets having different initial velocities and diameters than those described above without departing from the scope of the present disclosure.

The laser 102 is positioned behind the collector 106. During operation, the laser 102 outputs pulses of laser light 144 (see FIG. 2B). The pulses of laser light 144 are focused on a point through which the droplets pass on their way from the droplet generator 108 to the droplet receiver 110. Each pulse of laser light 144 is received by a droplet 142. When the droplet 142 receives the pulse of laser light 144, the energy from the laser pulse generates a high-energy plasma from the droplet 142. The high-energy plasma outputs extreme ultraviolet radiation.

In one embodiment, the laser 102 is a carbon dioxide ($CO_2$) laser. The $CO_2$ laser emits radiation or laser light 144 with a wavelength centered around 9.4 μm or 10.6 μm. The laser 102 can include lasers other than carbon dioxide lasers and can output radiation with other wavelengths than those described above without departing from the scope of the present disclosure.

In one embodiment, the laser 102 irradiates each droplet 142 with two pulses. A first pulse causes the droplet 142 to flatten into a disk like shape. The second pulse causes the droplet 142 to form a high temperature plasma. The second pulse is significantly more powerful than the first pulse. The laser 102 and the droplet generator 108 are calibrated so that the laser 102 emits pairs of pulses such that each droplet 142 is irradiated with a pair of pulses. For example, if the droplet generator 108 outputs 50,000 droplets per second, the laser 102 will output 50,000 pairs of pulses per second. The laser 102 can irradiate droplets 142 in a manner other than described above without departing from the scope of the present disclosure. For example, the laser 102 may irradiate each droplet 142 with a single pulse or with more pulses than two. Moreover, the primary laser here can not only cause droplet into disk-like shape but also can be mist or vapor state.

In one embodiment, the droplets 142 are tin. When the tin droplets 142 are converted to a plasma, the tin droplets 142 output extreme ultraviolet radiation 146 with a wavelength centered between 10 nm and 15 nm. More particularly, in one embodiment, the tin plasma emits extreme ultraviolet radiation with a central wavelength of 13.5 nm. These wavelengths correspond to extreme ultraviolet radiation. Materials other than tin can be used for the droplets 142 without departing from the scope of the present disclosure. Such other materials may generate extreme ultraviolet radiation with wavelengths other than those described above without departing from the scope of the present disclosure.

In one embodiment, the radiation 146 output by the droplets scatters randomly in many directions. The photolithography system 100 utilizes the collector 106 to collect the scattered extreme ultraviolet radiation 146 from the plasma and output the extreme ultraviolet radiation toward a photolithography target 104.

In one embodiment, the collector 106 is a parabolic or elliptical mirror. The scattered radiation 146 is collected and reflected by the parabolic or elliptical mirror with a trajectory toward the scanner 103. The scanner 103 utilizes a series of optical conditioning devices such as mirrors and lenses to direct the extreme ultraviolet radiation to the photolithography mask. The extreme ultraviolet radiation 146 reflects off of the mask onto a photolithography target. The extreme ultraviolet radiation 146 reflected from the mask patterns a photoresist or other material on a semiconductor wafer. For purposes of the present disclosure, particularities of the mask in the various configurations of optical equipment in the scanner 103 are not shown.

In one embodiment, the collector 106 includes a central aperture 125. The pulses of laser light 144 pass from the laser 102 through the central aperture 125 toward the stream of droplets 142. This enables the collector 106 to be positioned between the laser 102 and the photolithography target 104.

In one embodiment, the photolithography system 200 includes a plurality of light sensors 126. The light sensors 126 are positioned to detect side scattering of extreme ultraviolet radiation from the plasmatized droplets 142. The light sensors 126 can be part of a side scatter detection system 116 as described in relation to FIG. 1. The light sensor 126 here can also combine such as grating to extend the application or function into spectroscopy.

In one embodiment, the light sensors 126 collectively detect a current level of intensity of extreme ultraviolet light being generated in the plasma generation chamber 101. In particular, the light sensors 126 detect light from extreme ultraviolet radiation that is emitted with a substantially lateral trajectory.

In one embodiment, the light sensors 126 are utilized to detect Thomson scattering of extreme ultraviolet radiation from the plasmatized droplets. The Thomson scattering phenomenon is due to elastic scattering of electromagnetic radiation by a single free charged particle. This can be utilized as a high temperature plasma diagnostic technique. In particular, Thomson scattering measurements can be utilized to determine the ionization rate in the droplets. The intensity of scattered light is based, in part, on the extent of the laser to plasma interaction. Accordingly, the ionization rate can be retrieved from the intensity of scattered light. Thomson scattering intensity is independent of incident light wavelength. Thus Thomson scattering can be useful to analyze the relationship between the electric field of incident light and electron density. The light sensors 126 generate signals indicative of the intensity of side scattered light and passes the signals to the control system 114.

The total intensity of extreme ultraviolet light emitted by plasma can be estimated or calculated based on the amount of light received by the light sensors 126. On average, the plasma will emit extreme ultraviolet light at the same rate in all directions, or with known relationships between various scattering directions. Accordingly, the total intensity of extreme ultraviolet light can be estimated or calculated based on the light received by the light sensors 126.

In one embodiment, the light sensors 126 can be positioned substantially in a same lateral plane as the droplet generator 108 and the droplet receiver 110. Though FIGS. 2A-2C illustrate the light sensors 126 as being positioned slightly above the droplet generator 108 and the droplet receiver 110, in practice, the plurality of light sensors 126 may be positioned in a same XY plane as the droplet generator 108 and the droplet receiver 110. Alternatively, the light sensors 126 may be positioned in an XY plane above droplet generator 108 and the droplet receiver 110. Alternatively, the light sensors 126 may be positioned at varying heights equal to or above the droplet generator 108 and the droplet receiver 110.

In one embodiment, the photolithography system 200 includes a plurality of lenses 128. Each lens 128 is positioned to focus light scattered from the plasmatized droplets 142 onto or into the light sensors 126. Though the lenses 128 are shown as being positioned external to the plasma generation chamber 101, in practice, the lenses 128 may be positioned in other locations or orientations than those shown in FIGS. 2A-2C.

In one embodiment, the one or more lenses 128 are coupled to a rim of the collector 106. The lenses can be positioned in a same lateral plane as the droplet generator 108 and droplet receiver 110. Side scattered light from the plasma droplets passes through the lenses and is focused onto the light sensors 126.

In one embodiment, the one or more lenses 128 can correspond to windows in the wall of the plasma generation chamber 101. Accordingly, a wall of the plasma generation chamber 101 can include windows or apertures. Lenses 128, or lensing materials, can be positioned in the windows or apertures. When light is scattered from the plasma, the light passes through the windows and onto the light sensors. The lenses 128 positioned in the windows or apertures can focus the light onto the light sensors 126.

In one embodiment, the light sensors 126 provide sensor signals to the control system 114. The sensor signals are indicative of the intensity of light received by the light sensors 126. The control system 114 receives the sensor signals and can adjust parameters of the photolithography system 200 responsive to the sensor signals.

In one embodiment, the control system 114 adjusts parameters of the photolithography system 200 in order to more effectively generate extreme ultraviolet radiation. The control system 114 can adjust one or more of droplet speed, droplet size, laser pulse power, laser pulse timing, laser pulse train profile, initial droplet temperature, pressure within the plasma generation chamber, or other parameters.

In one embodiment, adjusting aspects of the laser pulses can include adjusting the flattening pulse that initially flattens the droplets 142. As described previously, before generating a plasma from a droplet, the laser 102 irradiates the droplet 142 with a flattening pulse that flattens the droplet. The flattening pulse flattens the droplet 142 substantially into the shape of a thin disk. The overall shape of the disc or pancake determines, in part, how effectively the plasma can be generated from the droplet 142 by the subsequent plasma generation pulse. Accordingly, the parameters of the flattening pulse determine, in part, how effectively the plasma can be generated from the droplets. This in turn affects how efficiently extreme ultraviolet radiation can be generated from the droplets. The control system 114 can adjust aspects of the flattening laser pulses responsive to the sensor signals.

In one embodiment, adjusting aspects of the laser pulses can include adjusting the plasma generation pulse that generates the plasma from the flattened droplet 142. The plasma generation pulse is utilized to generate a plasma from the flattened droplet. The timing, pulse shape, and power of the plasma generation pulse can be adjusted by the control system 114 responsive to the sensor signals from the light sensors 126.

In one embodiment, the photolithography system includes charged particle detectors 130. The charged particle detectors 130 can be part of a charged particle detection system, such as the charged particle detection system 118 of FIG. 1. The charged particle detectors 130 are configured to detect charged particles ejected from the plasma.

As described previously, the process of generating a plasma results in the generation of charged particles in the droplets. Some of the charged particles may be ejected from or may otherwise travel away from the droplets. The characteristics of the charged particles ejected from the plasma are indicative of characteristics of the plasma itself. The characteristics of the charged particles can include velocity of the charged particles, the energy of the charged particles, the trajectory of the charged particles, the number of charged particles emitted per droplet, and other characteristics.

FIG. 2C illustrates charged particles 148 scattering from a plasmatized droplet 142. For clarity, FIG. 2C does not illustrate the extreme ultraviolet radiation 146 that is also emitted from the plasmatized droplet 142. The charged particle detectors 130 are configured to detect the charged particles 148 emitted from the plasmatized droplet 142.

In one embodiment, the charged particle detectors 130 are coupled to the control system 114. The charged particle detectors 130 are configured to generate sensor signals indicative of parameters of the charged particles. The charged particle detectors 130 pass the sensor signals to the control system 114.

In one embodiment, an array of charged particle detectors 130 is positioned within the plasma generation chamber 101. The array of charged particle detectors 130 can be positioned to detect a variety of charged particle trajectories within the plasma generation chamber 101. In other words, the charged particle detectors 130 can be positioned in various locations throughout the plasma generation chamber 101. Each of the charged particle detectors 130 detects impacts of charged particles on the charged particle detectors 130. The charged particle detectors 130 pass sensor signals indicative of characteristics of the charged particles to the control system 114.

FIGS. 2A-2C illustrate the charged particle detectors 130 as being positioned on an exterior wall of the plasma generation chamber 101. However, the charged particle detectors 130 can be positioned within the plasma generation chamber 101. For example, the charged particle detectors 130 can be positioned on an interior wall of the plasma generation chamber 101. Alternatively, the charged particle detectors 130 can be positioned, supported, or arranged in other ways in an interior or an exterior of the plasma generation chamber 101. In one embodiment, the plasma generation chamber 101 can include apertures that permit charged particles 148 to pass from an interior of the plasma generation chamber 101 to the charged particle detectors 130.

In one embodiment, the charged particle detectors 130 include charge coupled devices configured to detect impacts from charged particles 148. The charge coupled devices generate signals each time a charged particle impacts the charge coupled devices. The charge coupled devices then pass sensor signals to the control system 114.

In one embodiment, the charge coupled devices for detecting charged particles include electron multiplying charge coupled devices. The electron multiplying charge coupled devices are frame transfer charge coupled devices that include an output register. The electron multiplying charge coupled device can include a fluorescent film or sheet positioned in front of a sensor area of the charge coupled device. When charged particles 148 impact the florescent film, the florescent film emits light. The light is sensed by the charge coupled device and the charge coupled device counts the impact of the charged particle.

In one embodiment, the charged particle detectors can include Faraday cups. A Faraday cup is a conductive receptacle that is configured to detect or capture charged particles 148 in a vacuum, such as a vacuum in the plasma generation chamber 101. The Faraday cup generates a current based on the charged particles 148 captured by the Faraday cup. This current can be utilized to determine the number of charged particles 148 that impact the cup. The Faraday cups can provide sensor signals to the control system 114 indicative of the number of charged particles 148 collected or captured by the Faraday cups.

In one embodiment, the photolithography system 200 includes an electron capture box 139 and an ion capture box 140 coupled to or part of the scanner 103. As described previously, some of the charged particles 148 are electrons and some of the charged particles 148 are ions. The electron capture box 139 and the ion capture box 140, in conjunction with first and second deflectors 134*a* and 134*b*, are respectively configured to capture electrons and ions. The function of the deflectors 134*a*, 134*b* will be described in more detail below.

The charged particle detector 136 is positioned in the electron capture box 139. After charged particles 148 pass through the intermediate focus aperture 120 into the scanner 103, the deflectors 134*a*, 134*b* deflect electrons into the electron capture box 139. The deflectors 134*a*, 134*b* deflect ions into the ion capture box 140. The charged particle detector 136 is configured to detect electrons that enter the scanner 103.

In one embodiment, charged particle detector 136 is an electron multiplying charge coupled device. As described previously, the electron multiplying charge coupled device can be a frame transfer charge coupled device that includes an output register. The electron multiplying charge coupled device can include a fluorescent film or sheet positioned in front of a sensor area of the electron multiplying charge coupled device. When electrons impact the florescent film, the florescent film emits light. The light is sensed by the electron multiplying charge coupled device and the electron multiplying charge coupled device counts the impact of the charged particle.

The charged particle detector 136 can be coupled to the control system 114. The charged particle detector 136 can be part of a charged particle detection system. For example, the charged particle detector 136 can be part of the charged particle detection system 118 of FIG. 1.

An electromagnetic lens 138 is positioned in the scanner 103. The electromagnetic lens 138 is configured to focus electrons toward the charged particle detector 136. The electromagnetic lens 138 utilizes electromagnetic forces to act as a lens for electrons that enter the scanner 103. The electromagnetic lens 130 can help to assure that a high percentage of the electrons that enter the scanner 130 are detected at the charged particle detector 136.

Though a single charged particle detector 136 is shown in FIGS. 2A-2C, in practice the photolithography system 200 can include multiple charged particle detectors 136. In particular, the electron capture box 139 can include multiple charged particle detectors 136. Though not shown in FIGS. 2A-2C, the charged particle capture box 140 can also include one or more charged particle detectors configured to detect ions that enter the scanner 103.

In one embodiment, the charged particle detector 136 positioned within the scanner 103 can act as a z-axis charged particle detector in an example in which the z-axis corresponds to an axis extending between the collector 106 and the intermediate focus aperture 120. As will be described in more detail below, the charged particle detector 136 can act as a z-axis charged particle detector while the charged particle detectors 130 can act as detectors for other axes or angles.

In one embodiment, the collector 106 includes charged particle detectors. The charged particle detectors on the collector 106 can be utilized to assist in determining a z-axis distribution of charged particles from the plasmatized droplets 142. The charged particle detectors can be positioned at various locations on the collector 106. In one embodiment, the charged particle detectors can be positioned in or adjacent to the apertures in the collector 106.

In one embodiment, the control system 114 can adjust parameters of the photolithography system 100 responsive to the sensor signals from the charged particle detectors 130 and/or 136. The control system 114 can adjust the same sorts of parameters of the photolithography system 200 as those described previously in relation to the light sensors 126. The control system 114 can adjust the parameters of the photolithography system 200 in order to more effectively generate extreme ultraviolet radiation for performing photolithography.

In one embodiment, the control system 114 can generate a 3D model of the droplets 142 after the flattening pulse and/or the plasma generation pulse. Because the charged particle detectors 130, 136 are positioned in various locations throughout the plasma generation chamber 101 and/or the scanner 103, the sensor signals from the various charged particle detectors can be utilized to generate a 3D model of the droplets prior to injection of the charged particles. The 3D model can indicate a shape of the flattened droplets after the flattening pulse and before the plasma generation pulse. Alternatively, or additionally, the 3D model can indicate a shape of the flattened droplets after the plasma generation pulse. The control system 114 can analyze the 3D model in order to determine whether the flattening pulse, the plasma generation pulse, the droplet speed, droplet size, the initial droplet temperature, or other parameters should be adjusted in order to generate a plasma having a selected shape from the droplets. Accordingly, the control system 114 can adjust parameters of the photolithography system 100 responsive to sensor signals from the charged particle detectors.

In one embodiment, the control system 114 adjust parameters of the photolithography system 100 responsive to sensor signals from the light sensors 126 and the charged particle detectors 130, 136. The control system 114 can generate a model of the flattened droplets 142, the plasmatized droplets 142, or of other aspects of the plasma or droplets 142 based on the combination of sensor signals from both the light sensors 126 and the charged particle sensors 130, 136.

In one embodiment, the deflectors 134*a*, 134*b* are positioned within the scanner 103. The deflectors 134*a*, 134*b* can be part of a charged particle deflection system. For example, the deflectors 134*a*, 134*b* can be part of the charged particle deflection system 119 of FIG. 1. The charged particle deflectors 134*a*, 134*b* are configured to protect sensitive equipment within the scanner 103 from being damaged by charged particles 148 entering the scanner 103 from the plasma generation chamber 101. In particular, some charged particles 148 from the plasma may pass from the plasma generation chamber 101 through the intermediate focus aperture 120 into the scanner 103. If the charged particles 148 impact the mask or other sensitive components within the scanner 103, then the photolithography system or process may be heavily damaged. Accordingly, the deflectors 134*a*, 134*b* protect the sensitive components of the scanner 103 by deflecting charged particles 148 away from the sensitive components of the scanner 103. In particular, the deflectors 134*a*, 134*b* are configured to deflect electrons into the electron capture box 139 and to deflect ions into the ion capture box 140.

In one embodiment, the deflectors 134*a*, 134*b* generate a magnetic field in a vicinity between the intermediate focus aperture 120 and sensitive equipment of the scanner 103. As the charged particles 148 travel through the magnetic field generated by the deflectors 134*a*, 134*b*, the trajectory of the charged particles 148 is adjusted due to the forces that act upon charged particles 148 traveling through the magnetic field. The direction of the magnetic field is selected to cause charged particles that have an initial trajectory toward sensitive components within the scanner 103 to divert to a harmless trajectory. The charged particles 148 can then be collected or captured, thereby preventing damage to sensitive components within the scanner 103.

In one embodiment, the first deflector 134*a* may generate a magnetic field sufficient to deflect electrons that have comparatively low masses. The electrons initially have a trajectory generally in the Z direction. As the electrons pass through the magnetic field generated by the deflector 134*a*, the trajectories of the electrons are adjusted by the Lorentz force. The Lorentz force Facts on a charged particle with charge q and velocity v that passes through a magnetic field B in accordance with the following formula:

$$F = q^{*}vXB,$$

where F, v, and B are vectors, and X represents the cross product operator. The magnetic field generated by the deflector 134*a* is configured to cause the negatively charged electrons to deflect into the electron capture box 139. The electromagnetic lens 138 focuses the electrons toward the charged particle detector 136.

In one embodiment, the first deflector 134*a* deflects positively charged ions toward the ion capture box 140. The positive charge of the ions and the negative charge of the electrons result in their being diverted in different directions by the deflector 134*a*.

In one embodiment, the photolithography system 200 utilizes a second deflector 134*b* to more effectively deflect positively charged ions into the ion capture box 140. The positively charged ions typically are far more massive than the electrons. In an example in which the positively charged ions are tin ions, the mass of the positively charged ions is several orders of magnitude larger than the mass of the electrons. Accordingly, a single deflector 134*a* may not sufficiently deflect the ions away from sensitive components of the scanner 103 and into the ion capture box 140. For this reason, the photolithography system 200 may include the second deflector 134*b* to further deflect the ions into the ion capture box 140. The second deflector 134*b* may be substantially similar to the first deflector 134*a* in that the second deflector 134*b* generates a magnetic field. The second deflector may generate a magnetic field that is much stronger than the magnetic field of the first deflector 134*a*. Other numbers and arrangements of deflectors may be utilized without departing from the scope of the present disclosure.

In one embodiment, the deflectors 134*a*, 134*b* can include electromagnets. The electromagnets can be positioned within the scanner 103 and can generate magnetic fields in accordance with well understood electromagnetic principles. The electromagnets can include one or more conductors that pass an electric current, thereby generating a magnetic field. Alternatively, the deflectors 134*a*, 134*b* can include other types of magnets or other types of components that generate magnetic fields without departing from the scope of the present disclosure. In some cases, the deflectors 134*a*, 134*b* may be positioned external to the scanner 103 but may still generate magnetic fields within the scanner 103 in order to deflect the charged particles 148.

In one embodiment, the control system 114 can include one or more controllers or processors. The control system 114 can include one or more computer memories that can store instructions and data. The controllers or processors can execute the instructions and process the data. For example, the processors and instructions can be utilized to assist in adjusting or controlling parameters of the photolithography system 200 responsive to the sensor signals received from the light sensors 126 and/or the charged particle detectors 130, 136.

In one embodiment, the control system 114 utilizes machine learning to accurately adjust the parameters of the photolithography system 200. Accordingly, the control system 114 can include a machine learning model that can be trained to adjust one or more parameters of the laser pulses or droplets 142 responsive to sensor signals received from the light sensors 126 and/or the charged particle detectors 130, 136. Details of a machine learning process are described in relation to FIG. 7.

In one embodiment, the machine learning model includes a neural network. The machine learning model can include one or more neural network-based supervised machine learning models. The machine learning model can include one or more unsupervised machine learning models. Other types of machine learning models can be utilized for controlling the speed of droplets without departing from the scope of the present disclosure. For example, machine learning models other than neural network-based machine learning models can be utilized by the control system 114. Further details of an analysis model are provided in relation to FIG. 7.

The image generated from electron multiplying type charge coupled devices may need post processing due to different electron energies with different deflective directions. The image can include energy (distribution on image) and counts (intensity on image) information. Therefore, to recover an XY plane image to resolve original distribution, corrections may be made. By known optics specification, the position in a volume with a particular geometry can be estimated.

In one embodiment, by recording the information from Thomson scattering phenomenon and electron distribution in space, the original electron density distribution from the plasma could be computed in multiple dimensions. With optical imaging theory and optics specifications, the plasma deformation from aberrations can be corrected by the control system 114. From Thomson scattering theory, the relation between incident light intensity and the electron density distribution can also be retrieved. By analyzing the relation of electrons distribution in space and combining the results in three dimensions, the control system 114 can compose a 3D plasma model.

Figure 3:
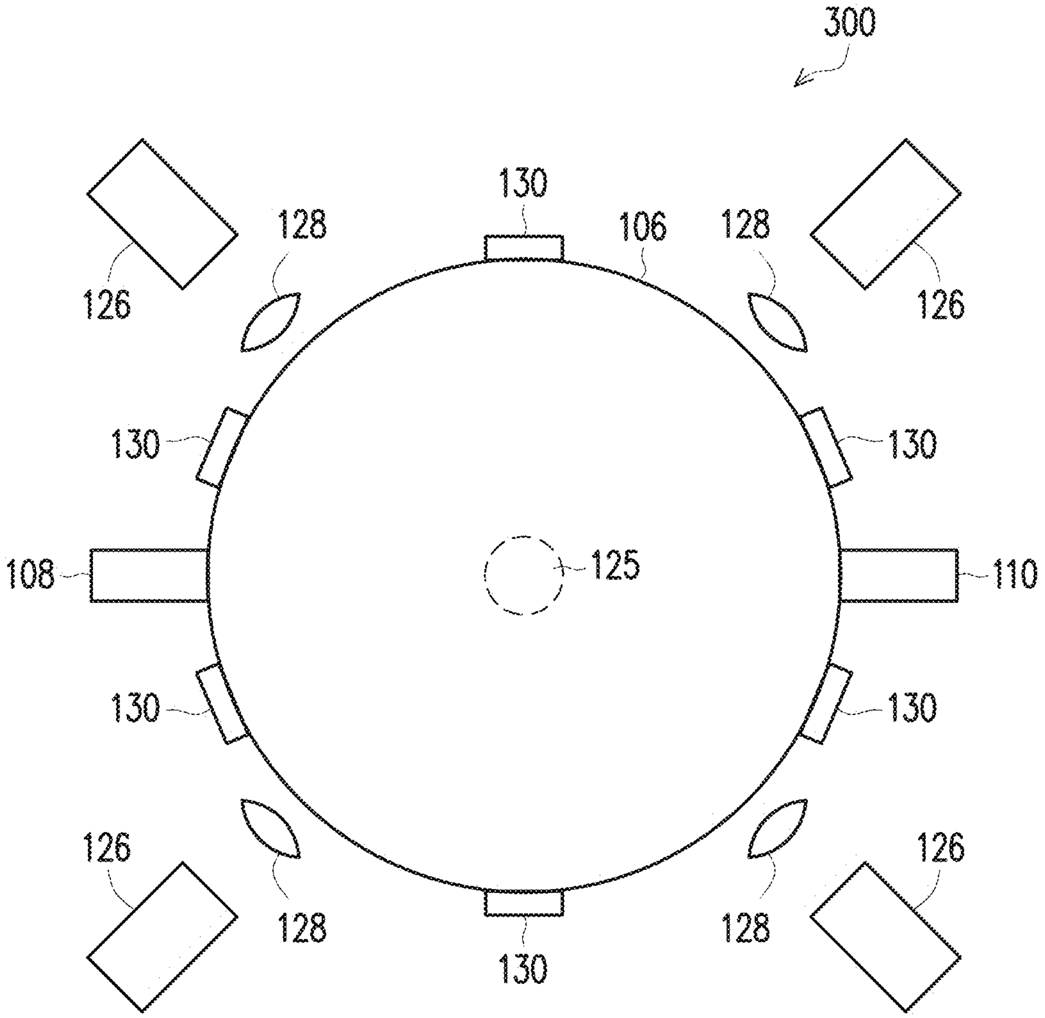
FIG. 3 is a top view of a portion of a photolithography system, according to one embodiment.

FIG. 3 is a top view of a portion of a photolithography system 300, according to one embodiment. The photolithography system 300 is substantially similar to the photolithography system 200 described in relation to FIGS. 2A-2C, except that a particular distribution of light sensors 126 and charged particle detectors 130 is shown in FIG. 3. The photolithography system includes a collector 106. The collector 106 includes a central aperture 125 through which laser pulses can pass in order to flatten and plasmatize the droplets 142.

The photolithography system 300 includes a plurality of light sensors 126 positioned radially around and above the collector 106. The light sensors 126 can be substantially similar to the light sensors 126 described in relation to FIGS. 2A-2C. The light sensors 126 can be configured to sense side scattered extreme ultraviolet light from plasmatized droplets 142. The light sensors 126 can be configured to provide sensor signals to the control system 114. The photolithography system 300 includes lenses 128 configured to direct light onto the light sensors 126. The lenses 128 can be substantially similar to the lenses 128 described in relation to FIGS. 2A-2C.

The photolithography system 300 includes a plurality of charged particle detectors 130 positioned radially around and above the collector 106. The charged particle detectors 130 can be substantially similar to the charged particle detectors 130 described in relation to FIGS. 2A-2C. The charged particle detectors 130 can be configured to provide sensor signals to the control system 114.

Figure 4:
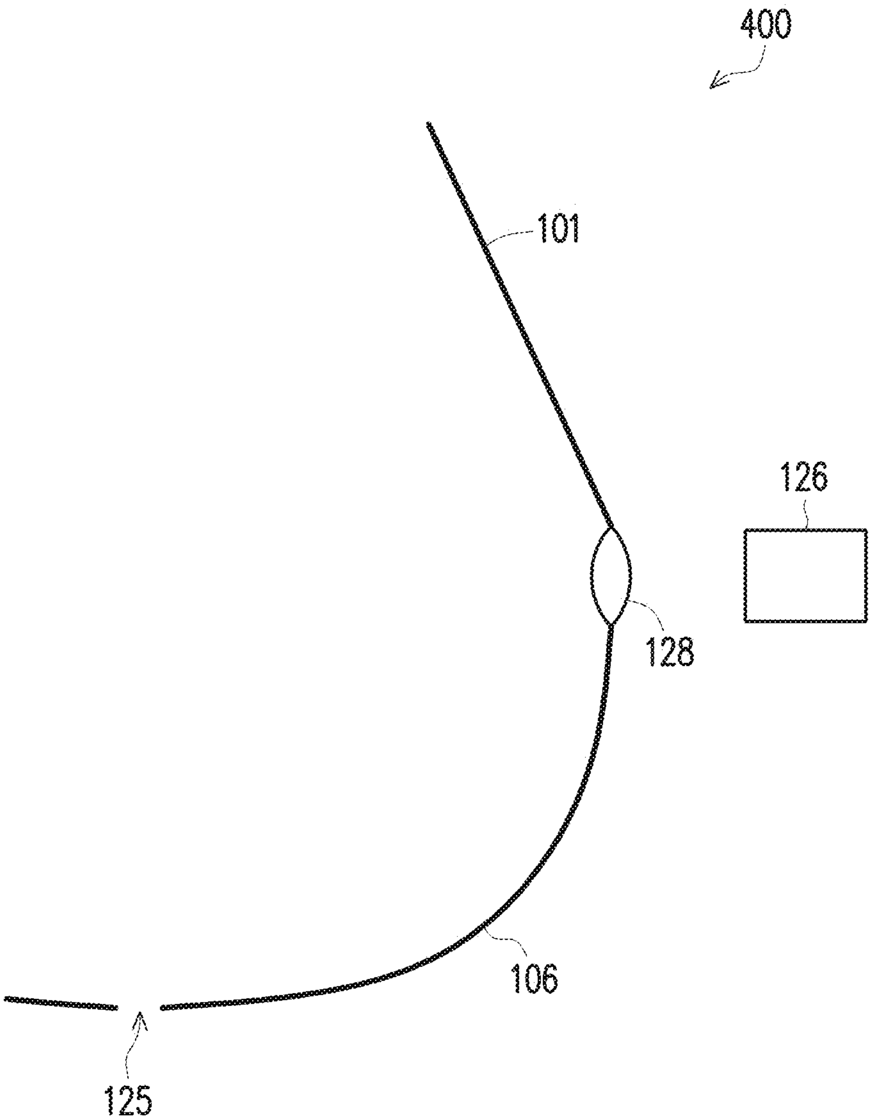
FIG. 4 is a side view of a portion of a photolithography system, according to one embodiment.

FIG. 4 is an illustration of a photolithography system 400, according to one embodiment. The photolithography system 400 is substantially similar to the photolithography system 200 of FIGS. 2A-2C, except for the placement of the lenses 128. The view of FIG. 4 illustrates a portion of the collector 106 and the plasma generation chamber 101. The photolithography system 400 differs from the photolithography system 200 in that a lens 128 coupled to a rim of the collector 106. The wall of the plasma generation chamber 101 is coupled to the lens 128. The lens 128 is configured to direct side scattered radiation from plasmatized droplets 142 onto the light sensor 126. In practice, the photolithography system 400 can include a plurality of lenses 128 coupled to the rim of the collector 106 and arranged radially and each configured to direct side scattered radiation to a light sensor 126. Lenses 128 and light sensors 126 can perform substantially similar functions to the lenses 128 and light sensors 126 described in relation to FIGS. 2A-2C.

Figure 5:
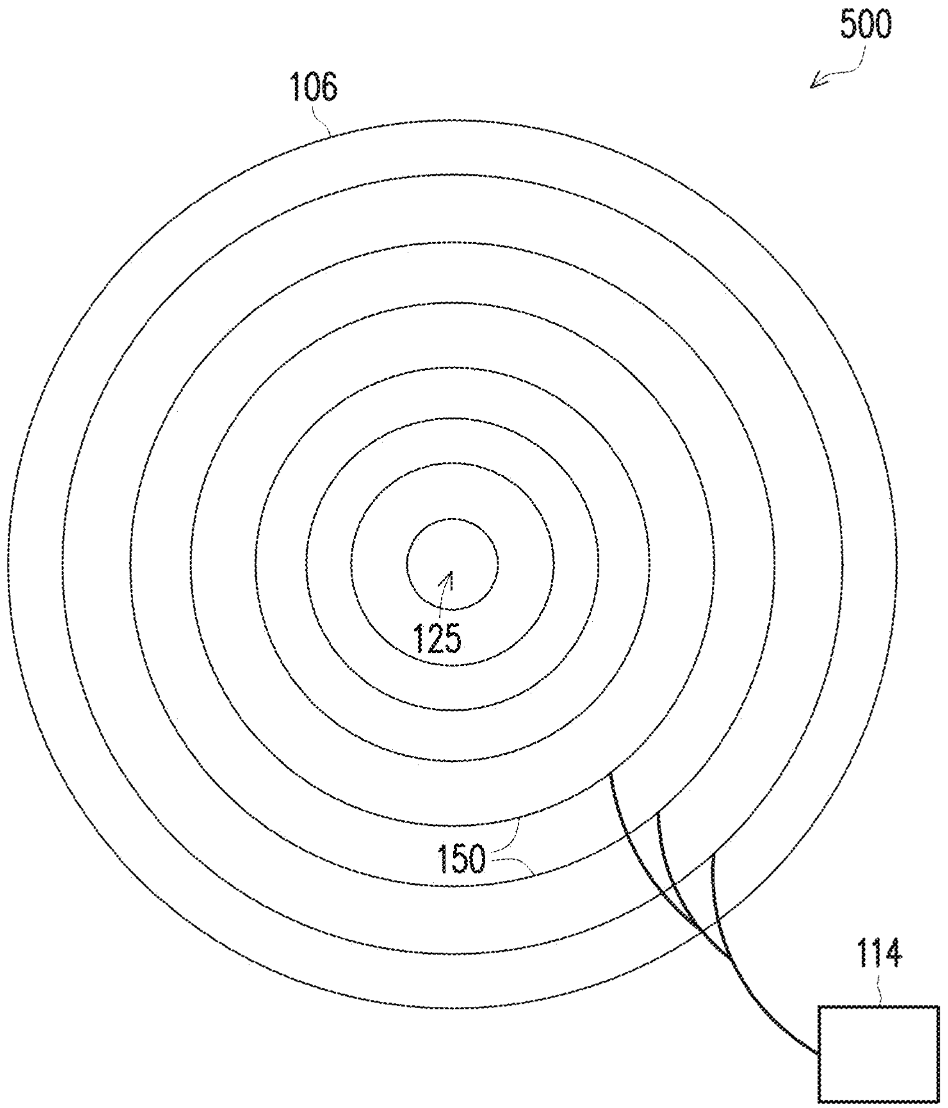
FIG. 5 is a top view of a portion of a photolithography system, according to one embodiment.

FIG. 5 is a top view of a photolithography system 500, according to one embodiment. The photolithography system 500 is substantially similar to the photolithography system 200 of FIGS. 2A-2C, except the collector 106 includes a grating structure 150 that assists in detecting ions and charge particles emitted from plasmatized droplets 142. For simplicity, FIG. 5 does not illustrate lenses 128, light sensors 126, charged particle detectors 130, and other components illustrated in the photolithography system 200, though such components may also be present in the photolithography system 500. The collector 106 of FIG. 5 is a grated collector. The grated collector includes a periodic grating structure. The periodic grating structure includes periodic bands 150 of material sensitive to ions of charged particles. The periodic bands 150 generate electrical signals upon contact with a charged particle. Each of the bands 150 is coupled to the control system 114. The bands provide sensor signals indicative of charged particles 148 that contact the bands 150. The control system 114 can analyze the sensor signals and adjust parameters of the photolithography system 500, responsive to the sensor signals.

In one embodiment, the collector 106 surface has a grating structure. The grating structure is arranged as a coaxial band shape. The purpose is to filter out of band wavelengths. Charged particle detectors can be placed between grating bands and can be used to catch downward ions and electrons. Moreover, by arranging some charged particle detectors on the cone chamber environment, the resolved plasma information can be more detailed for improved analysis. The system error and detector positions to plasma source can be corrected by a machine learning or artificial intelligence system. This can be combined with the side scattering information and the deflection system. By known information of moving ions/electrons angle, position, velocity, flying timing and energy, the plasma distribution can be calculated and a 3D model can be built. Moreover, the moving ions and electrons could be deflected by a strong magnetic field to avoid damage to the mask and sensitive parts in the scanner.

Figure 6:
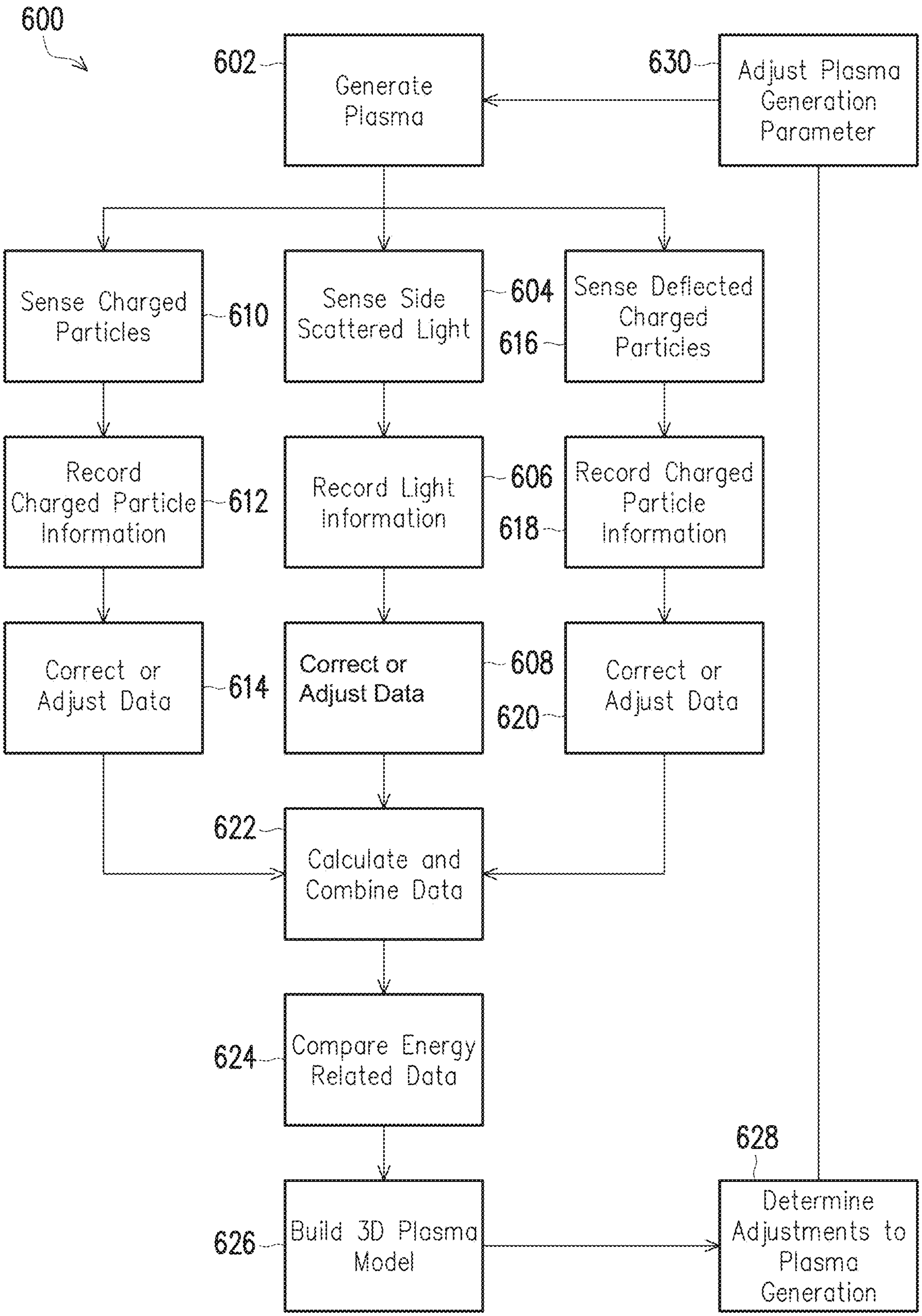
FIG. 6 is a flow diagram of a method for operating a photolithography system, according to one embodiment.

FIG. 6 is a flow diagram of a method 600 for operating a photolithography system, according to one embodiment. The method 600 can utilize the structures and processes described in relation to FIGS. 1-5 in order to generate plasma and collect information as described below. At 602, the method 600 generates a plasma in a plasma generation chamber. The plasma can be generated by irradiating a droplet with a flattening laser pulse and then irradiating the droplets with a plasmatizing laser pulse that generates a plasma from the flattened droplet. The generation of plasma can utilize components and processes described previously in relation to FIGS. 1-5.

From 602, the method 600 proceeds to steps 604, 610, and 616. At 604, the method 600 senses side scattered light from the plasmatized droplets. In one example, the side scattered light can be sensed with light sensors 126 of FIGS. 2A-4. At 606, the method 600 records the side scattered light information. In one example, the control system 114 of FIGS. 2A-2C records the side scattered light information sensor signals received from the light sensors 126.

At 608, the method 600 corrects or adjusts the side scattered light information. The side scattered light is received by the light sensors 126 after passing through lenses 128. This means that the raw sensor data generated by the light sensors does not by itself represent the accurate distribution of side scattered light. Accordingly, before the side scattering data can be used to understand the state of the plasmatized droplets, the raw sensor data should be adjusted to account for the effect that the lenses 128 have on the side scattered light data. In other words, some mathematical transformations may be performed to adjust the raw side scattering data. In one example, the control system 114 of FIGS. 2A-2C can correct errors in the side scattered light data.

At 610, the method 600 senses parameters of charged particles emitted or ejected from the plasma. In one example, the parameters of the charged particles can be sensed by charged particle sensors 130 of FIGS. 2A-2C. The charged particle sensors 130 can sense velocity, intensity, energy, numbers, or other parameters of charged particles emitted from the plasma. At 612, the method 600 records the charged particle information. In one example, the control system 114 of FIGS. 2A-2C can record charged particle information based on sensor signals received from the charged particle sensors 130.

At 614, the method 600 corrects or adjusts the charged particle information. The correction or adjustment is based on the same principles as described above in relation to the side scattered light at 608. In particular, some calculations or transformations may need to be applied to the raw sensor data produced by the charged particle sensors 130 in order to correct for known distortions introduced by the charged particle sensors 130 or other components that may focus or direct the charged particles. In one example, the control system 114 of FIGS. 2A-2C can correct or adjust the charged particle data in preparation for analysis of the charged particle information.

At 616, the method 600 senses deflected charged particles. In one example, the charged particle detector 136 of FIGS. 2A-2C senses charged particles deflected by one or both of the deflectors 134*a*, 134*b* within the scanner 103. The charged particles sensed by the charged particle detector 136 can be indicative of a z-axis scattering of charged particles. At 618, the method 600 records charged particle information. In one example, the control system 114 of FIGS. 2A-2C receives sensor signals from the charged particle detector 136 of FIGS. 2A-2C and records charged particle data based on the sensor signals.

At 620, the method 600 corrects or adjusts the charged particle data. The correction or adjustment is based on the same principles as described above in relation to the side scattered light at 608. The charged particles that are sensed by the charged particle detector 136 may first be reflected by the reflector 106 and may then be deflected by the deflector 134*a*, and then focused by the electromagnetic lens 138. Accordingly, the raw sensor data provided by the charged particle detector 136 will have distortions based on the effects of these components. Accordingly, before the sensor data from the charged particle detector 136 can be used, some calculations or transformations may need to be applied to the raw sensor data in order to correct for known distortions introduced by the components mentioned above. In one example, the control system 114 of FIGS. 2A-2C can correct or adjust the charged particle data in preparation for analysis of the charged particle information.

From 608, 614, and 620, the method 600 proceeds to 622. At 622, the method 600 calculates and combines the side scattered light information, the charged particle information, and the deflected charged particle information. In one example, the control system 114 of FIGS. 2A-2C calculates various data from the adjusted recorded data and then combines the various data.

At 624, the method 600 compares energy-related data associated with the charged particles and/or the side scattered light. In one example, the control system 114 compares energy-related data associated with the charged particles and/or the side scattered light. The energy related data can include the energy of the sensed light and charged particles, as well as the intensity or count of light and charged particles. The amount of EUV radiation that can be generated is related to the energy of the plasma, which is in turn related to the intensity or count of light and charged particles. Accordingly, comparing the energy related data corresponds to determining the maximum amount of EUV light that could be generated with the current plasmatized droplets.

At 626, the method 600 builds a 3D model of the plasma. In one example, the control system 114 of FIGS. 2A-2C builds the 3D model based on the charged particle data, the side scattered light data, the deflected charged particle data, and the comparison of energy-related data. In particular, the X-Y distribution of the plasma can be calculated based on the side-scattered light information. The Z distribution of the plasma can be calculated based on the charged particle data sensed by the charged particle sensor 136. The 3D model may correspond to calculating the X-Y and Z distribution of the plasma, based on these parameters.

At 628, the method 600 determines adjustments to be made to the plasma generation process. In one example, the control system 114 analyzes the 3D plasma model and determines adjustments to be made to the plasma generation process based on analysis of the 3D model. Examples of adjustments can include adjusting the timing, position, power, duration, or profile of the flattening laser pulse. Examples of adjustments can include adjusting the timing, position, power, duration, or profile of the plasma generation laser pulse. Examples of adjustments can include adjusting a velocity of droplets, the size of droplets, the material of droplets, the temperature of droplets, the trajectory of droplets, or the shape of droplets.

In one embodiment, determining the adjustments to be made can be performed by an analysis model trained with a machine learning process. The analysis model and the machine learning process are described in further detail in relation to FIG. 7.

At 630, the method 600 adjusts the plasma generation parameters in accordance with the analysis of the 3D model. In one example, the control system 114 of FIGS. 2A-2C adjusts the plasma generation parameters. From 630, the process returns to 602, at which point the method 600 generates plasma with the adjusted plasma generation parameters. The method 600 can repeat itself throughout the extreme ultraviolet photolithography process in order to continuously update and adjust or correct plasma generation parameters in order to improve extreme ultraviolet photolithography processes.

In one embodiment, the method 600, or other embodiments of a photolithography system or method can include post processing of sensor data. For example an electron distribution image can be generated with one or more electron multiplying charge coupled devices. The image can be corrected by computing the original position and the real distribution in the XY plane can be generated. The control system can correct system error deformation and can compute electron density on target. This, together with Thomson scattering data, can be used to generate a 3D plasma model. Machine learning or artificial intelligence systems of the control system can analyze the model, or the conditions represented by the model, and determine appropriate adjustments to be made to the plasma generation parameters.

Figure 7:
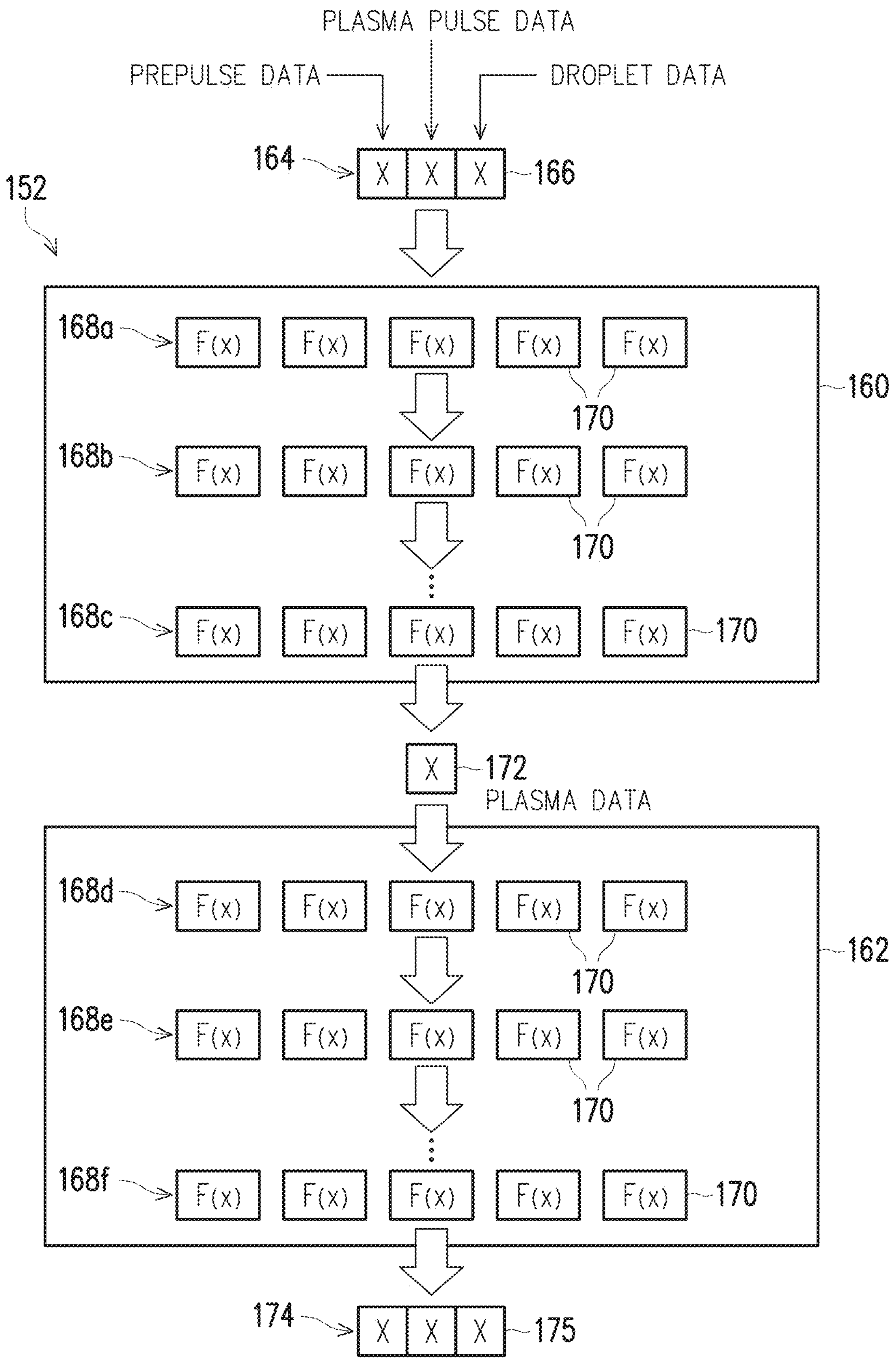
FIG. 7 is a block diagram of an analysis model, according to one embodiment.

FIG. 7 is a block diagram of an analysis model 152, according to one embodiment. The analysis model 152 can be part of the control system 114 of FIGS. 1-2A-2C and can operate in conjunction with the systems and processes described in relation to FIGS. 1-6, according to one embodiment. The analysis model 152 can perform functions associated with block 628 of FIG. 6. The analysis model 152 includes an encoder neural network 160 and a decoder neural network 162. The analysis model 152 is trained with a machine learning process to identify recommended changes to plasma generation parameters based on sensed plasma qualities, such as those sensed by the light sensors 126, the charged particle detectors 130, and the charged particle detector 138. The analysis model of FIG. 7 is only one example of an analysis model. Many other kinds of analysis models and training processes can be utilized without departing from the present disclosure.

The training process utilizes a training set. The training set includes historical plasma generation conditions data. Each set of historical plasma generation conditions data includes, for a particular EUV generation process, the parameters of the flattening laser pulse, the parameters of the plasmatizing laser pulse, and the parameters of the droplets. The training set includes, for each set of historical plasma generation conditions, historical plasma data that resulted from the historical plasma generation conditions.

Each previously performed EUV generation process took place with particular plasma generation conditions and resulted in particular plasma qualities. The plasma generation conditions for each plasma data value are formatted into a respective plasma generation conditions vector 164. The plasma generation conditions vector 164 includes a plurality of data fields 166. Each data field 166 corresponds to a particular process condition.

The example of FIG. 7 illustrates a single plasma generation conditions vector 164 that will be passed to the encoder 160 of the analysis model 152 during the training process. In the example of FIG. 7, the plasma generation conditions vector 164 includes three data fields 166. A first data field 166 corresponds to the prepulse laser settings. In practice, there may be multiple data fields 166 for the prepulse laser settings, one for each of pulse power, pulse duration, pulse timing, etc. A second data field 166 corresponds to plasmatizing laser pulse settings. In practice, there may be multiple data fields 166 for each of a plurality of settings include pulse power, pulse duration, pulse timing, and other factors. A third data field 166 corresponds to the droplet settings. In practice, there may be multiple data fields 166 for each of a plurality of droplet settings including droplet speed, droplet size, droplet temperatures, etc. Each plasma generation conditions vector 164 can include different types of plasma generation conditions without departing from the scope of the present disclosure. The particular plasma generation conditions illustrated in FIG. 7 are given only by way of example. Each process condition is represented by a numerical value in the corresponding data field 166.

The encoder 160 includes a plurality of neural layers 168*a-c*. Each neural layer includes a plurality of nodes 170. Each node 170 can also be called a neuron. Each node 170 from the first neural layer 168*a* receives the data values for each data field from the plasma generation conditions vector 164. Accordingly, in the example of FIG. 7, each node 170 from the first neural layer 168*a* receives three data values because the plasma generation conditions vector 164 has three data fields, though as mentioned above, in practice, the plasma generation conditions vector 164 may include many more data fields than 3. Each neuron 170 includes a respective internal mathematical function labeled F(x) in FIG. 7. Each node 170 of the first neural layer 168*a* generates a scalar value by applying the internal mathematical function F(x) to the data values from the data fields 166 of the plasma generation conditions vector 164. Further details regarding the internal mathematical functions F(x) are provided below.

In the example of FIG. 7, each neural layer 168*a*-168*e* in both the encoder 160 and the decoder 162 are fully connected layers. This means that each neural layer has the same number of nodes as the succeeding neural layer. In the example of FIG. 7, each neural layer 168*a*-168*e* includes five nodes. However, the neural layers of the encoder 160 and the decoder 162 can include different numbers of layers than are shown in FIG. 7 without departing from the scope of the present disclosure.

Each node 170 of the second neural layer 168*b* receives the scalar values generated by each node 170 of the first neural layer 168*a*. Accordingly, in the example of FIG. 7 each node of the second neural layer 168*b* receives five scalar values because there are five nodes 170 in the first neural layer 168*a*. Each node 170 of the second neural layer 168*b* generates a scalar value by applying the respective internal mathematical function F(x) to the scalar values from the first neural layer 168*a*.

There may be one or more additional neural layers between the neural layer 168*b* and the neural layer 168*c*. The final neural layer 168*c* of the encoder 160 receives the five scalar values from the five nodes of the previous neural layer (not shown). The output of the final neural layer is the predicted plasma data. In practice, the predicted plasma data will be a vector including many data fields. Each data field corresponds to a particular aspect of the sensed plasma qualities such as X-Y plasma distribution data, Z plasma distribution data, and other parameters generated from the sensor data provided by the light sensors 126, the charged particle sensors 130, and the charged particle detector 136.

During the machine learning process, the analysis model compares the predicted plasma data 172 to the actual plasma data. The analysis model 152 generates an error value indicating the error or difference between the predicted plasma data from the data value 172 (in practice a vector having many data values representing values associated with a 3D plasma model) and the actual plasma data. The error value is utilized to train the encoder 160.

The training of the encoder 160 can be more fully understood by discussing the internal mathematical functions F(x). While all of the nodes 170 are labeled with an internal mathematical function F(x), the mathematical function F(x) of each node is unique. In one example, each internal mathematical function has the following form:

$$F(x) = x_1 * w_1 + x_2 * w_2 + \ldots\ x_n * w_1 + b.$$

In the equation above, each value $x_1$-$x_n$ corresponds to a data value received from a node 170 in the previous neural layer, or, in the case of the first neural layer 168*a*, each value $x_1$-$x_n$ corresponds to a respective data value from the data fields 166 of the plasma generation conditions vector 164. Accordingly, n for a given node is equal to the number of nodes in the previous neural layer. The values $w_1$-$w_n$ are scalar weighting values associated with a corresponding node from the previous layer. The analysis model 152 selects the values of the weighting values $w_1$-$w_n$. The constant b is a scalar biasing value and may also be multiplied by a weighting value. The value generated by a node 170 is based on the weighting values $w_1$-$w_n$. Accordingly, each node 170 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions. Each function F(x) may also include a transfer function.

After the error value has been calculated, the analysis model 152 adjusts the weighting values $w_1$-$w_n$ for the various nodes 170 of the various neural layers 168*a*-168*c*.

After the analysis model 152 adjusts the weighting values $w_1$-$w_n$, the analysis model 152 again provides the plasma generation conditions vector 164 to the input neural layer 168*a*. Because the weighting values are different for the various nodes 170 of the analysis model 152, the predicted plasma data 172 will be different than in the previous iteration. The analysis model 152 again generates an error value by comparing the actual removal efficiency to the predicted plasma data 172.

The analysis model 152 again adjusts the weighting values $w_1$-$w_n$ associated with the various nodes 170. The analysis model 152 again processes the plasma generation conditions vector 164 and generates a predicted plasma data 172 and associated error value. The training process includes adjusting the weighting values $w_1$-$w_n$ in iterations until the error value is minimized.

FIG. 7 illustrates a single plasma generation conditions vector 164 being passed to the encoder 160. In practice, the training process includes passing a large number of plasma generation conditions vectors 164 through the analysis model 152, generating a predicted plasma data 172 for each plasma generation conditions vector 164, and generating an associated error value for each predicted plasma data. The training process can also include generating an aggregated error value indicating the average error for all the predicted plasma data for a batch of plasma generation conditions vectors 164. The analysis model 152 adjusts the weighting values $w_1$-$w_n$ after processing each batch of plasma generation conditions vectors 164. The training process continues until the average error across all plasma generation conditions vectors 164 is less than a selected threshold tolerance. When the average error is less than the selected threshold tolerance, the training of the encoder 160 is complete and the analysis model is trained to accurately predict the plasma data based on the plasma generation conditions.

The decoder 162 operates and is trained in a similar manner as the encoder 160 as described above. During the training process of the decoder 162, the decoder receives plasma quality data associated with a plasma generation conditions vector 164. The plasma quality data is received by each node 170 of the first neural layer 168*d* of the decoder 162. The nodes 170 and the first neural layer 168*d* apply their respective functions F(x) to the plasma quality data values and pass the resulting scalar values to the nodes 170 of the next neural layer 168*e*. After the final neural layer 168*f* processes the scalar values received from the previous neural layer (not shown), the final neural layer 168*f* outputs a predicted plasma generation conditions vector 174. The predicted plasma generation conditions vector 174 has the same form as the plasma generation conditions vector 164. The data fields 175 of the predicted plasma generation conditions vector 174 represent the same parameters or conditions as the data fields 166 of the plasma generation conditions vector 164.

The training process compares the predicted plasma generation conditions vector 174 to the plasma generation conditions vector 164 and determines an error value. The weighting parameters of the functions F(x) of the nodes 170 of the decoder 162 are adjusted and the plasma quality data is again provided to the decoder 162. The decoder 162 again generates a predicted plasma generation conditions vector 174 and an error value is determined. This process is repeated for all of the plasma generation conditions vectors in the historical plasma generation conditions data and for all of the historical plasma quality data from the historical plasma data until the decoder 162 can generate, for each historical plasma data value, a predicted plasma generation conditions vector 172 that matches the corresponding plasma generation conditions vector 164. The training process is complete when a prediction cumulative error value is lower than the threshold error value.

After the encoder 160 and the decoder 162 have been trained as described above, the analysis model 152 is ready to generate recommended plasma generation to improve the plasma quality, and hence, the resulting EUV quality produced by the EUV photolithography systems described in relation to FIGS. 1-6. During operation, the analysis model receives a current plasma generation conditions vector representing current conditions or parameters of the EUV photolithography systems described in relation to FIGS. 1-6. The encoder 160 processes the current plasma generation conditions vector and generates a predicted future plasma data based on the current plasma generation conditions vector. If the predicted future plasma data is less than desired, then the decoder 162 is utilized to generate a set of recommended plasma generation conditions that will result in a higher plasma quality. In particular, the decoder 162 receives increased plasma quality values. The decoder 162 then generates a predicted plasma generation conditions vector based on the higher removal efficiency data value.

The predicted plasma generation conditions vector includes recommended plasma generation conditions values for certain of the plasma generation conditions types. For example, the predicted plasma generation conditions vector can include a recommended values for the various prepulse laser conditions, the plasmatizing laser pulse conditions, and the droplet conditions.

Many other kinds of analysis models, training processes, and data forms can be utilized without departing from the scope of the present disclosure.

Figure 8:
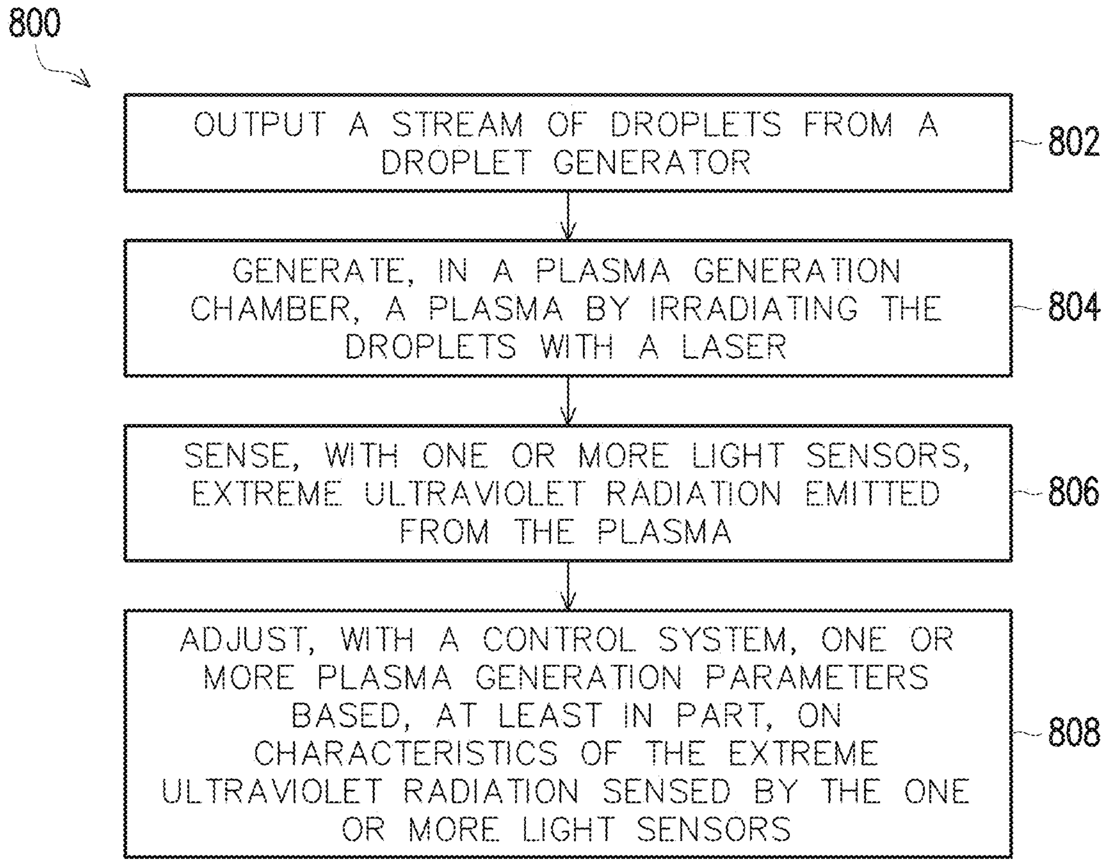
FIG. 8 is a flow diagram of a method for operating a photolithography system, according to one embodiment.

FIG. 8 is a method 800 for dynamically adjusting plasma generation parameters in an extreme ultraviolet radiation photolithography system, according to an embodiment. At 802, the method 800 includes outputting a stream of droplets from a droplet generator. One example of a droplet generator is the droplet generator 108 of FIG. 1. One example of droplets is the droplets 142 of FIGS. 2A-2C. At 804, the method 800 includes generating, in a plasma generation chamber, a plasma by irradiating the droplets with a laser. One example of a plasma generation chamber is the plasma generation chamber 101 of FIGS. 2A-2C. One example of a laser is the laser 102 of FIGS. 2A-2C. At 806, the method 800 includes sensing, with one or more light sensors, extreme ultraviolet radiation emitted from the plasma. One example of a light sensor is the light sensor 126 of FIGS. 2A-2C. At 808, the method 800 includes adjusting, with the control system, one or more plasma generation parameters based, at least in part, on characteristics of the extreme ultraviolet radiation sensed by the one or more light sensors. One example of the control system is the control system 114 of FIGS. 2A-2C.

Figure 9:
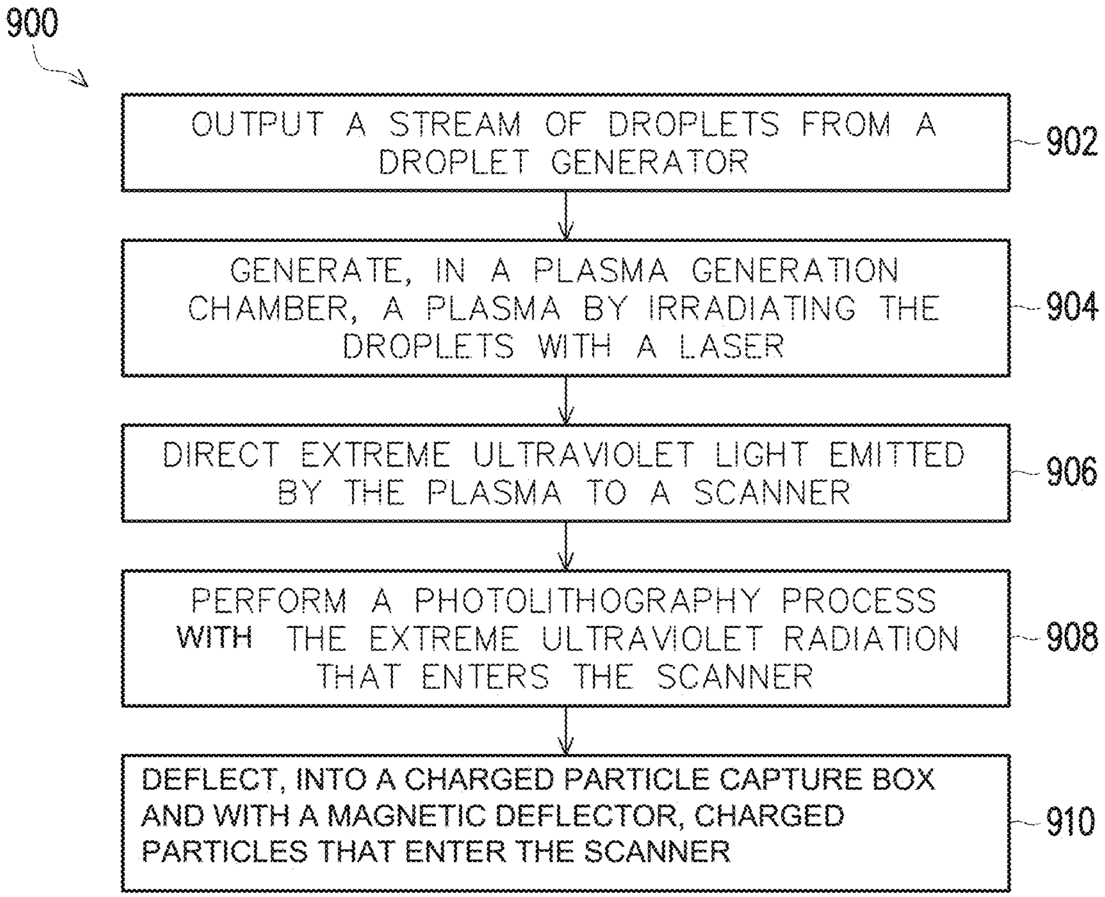
FIG. 9 is a flow diagram of a method for operating a photolithography system, according to one embodiment.

FIG. 9 is a method 900 for reducing damage from charged particles in an extreme ultraviolet radiation photolithography system, according to an embodiment. At 902, the method 900 includes outputting a stream of droplets from a droplet generator. One example of a droplet generator is the droplet generator 108 of FIGS. 2A-2C. One example of droplets is the droplets 142 of FIGS. 2A-2C. At 904, the method 900 includes generating, in a plasma generation chamber, a plasma by irradiating the droplets with a laser. One example of a plasma generation chamber is the plasma generation chamber 101 of FIGS. 2A-2C. One example of a laser is the laser 102 of FIGS. 2A-2C. At 906, the method 900 includes directing extreme ultraviolet light emitted by the plasma to a scanner. One example of a scanner is the scanner 103 of FIGS. 2A-2C. At 908, the method 900 includes performing a photolithography process when the extreme ultraviolet radiation enters the scanner. At 910, the method 900 includes deflecting, into a charged particle box and with a magnetic deflector, charged particles that enter the scanner. One example of a charged particle capture box is the electron capture box 139 of FIGS. 2A-2C. One example of a magnetic deflector is the deflector 134*a* of FIGS. 2A-2C.

In one embodiment, a photolithography system includes a plasma generation chamber and a droplet generator configured to output a stream of droplets into the plasma generation chamber. The system includes a laser configured to generate a plasma from the droplets by irradiating the droplets in the plasma generation chamber. The system includes one or more light sensors configured to detect extreme ultraviolet radiation emitted from the plasma and to output first sensor signals indicative of the extreme ultraviolet radiation. The system includes a control system configured to receive the first sensor signals, to analyze the first sensor signals, and to adjust plasma generation parameters based, at least in part, on the first sensor signals.

In one embodiment, a method includes outputting a stream of droplets from a droplet generator, generating, in a plasma generation chamber, a plasma by irradiating the droplets with a laser. The method includes sensing, with one or more light sensors, extreme ultraviolet radiation emitted from the plasma and adjusting, with a control system, one or more plasma generation parameters based, at least in part, on characteristics of the extreme ultraviolet radiation sensed by the one or more light sensors.

In one embodiment, a method includes outputting a stream of droplets from a droplet generator and generating, in a plasma generation chamber, a plasma by irradiating the droplets with a laser and directing extreme ultraviolet light emitted by the plasma to a scanner. The method includes performing a photolithography process with the extreme ultraviolet radiation that enters the scanner. The method includes deflecting, into a charged particle capture box and with a magnetic deflector, charged particles that enter the scanner.

Embodiments of the present disclosure provide many benefits to extreme ultraviolet radiation photolithography systems. Embodiments of the present disclosure dynamically adjust plasma generation properties based on various sensors and machine learning processes. Embodiments of the present disclosure also deflect charged particles from damaging sensitive components of the photolithography system. Accordingly, embodiments of the present disclosure reduce damage to expensive photolithography components including photolithography masks, optical systems, and semiconductor wafers. Additionally, embodiments of the present disclosure improve the efficiency of generation of extreme ultraviolet light by dynamically adjusting parameters of the photolithography system responsive to the sensor signals.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
- an EUV generator configured to generate EUV light;
- a scanner configured to receive the EUV light and to perform a photolithography process on a wafer with the EUV light;
- a first magnetic deflector in the scanner;
- a second magnetic deflector in the scanner downstream from the first magnetic deflector;
- a first charged particle capture box in the scanner;
- a first electromagnetic lens in the first charged particle capture box; and
- a second charged particle capture box in the scanner.

2. The system of claim 1, further comprising one or more charged particle detectors configured to sense the charged particles and to output sensor signals indicative of the charged particles.

3. The system of claim 2, wherein the one or more charged particle detectors include a charge coupled device.

4. The system of claim 3, wherein the one or more charged particle detectors are positioned within the EUV generator.

5. The system of claim 2, wherein the one or more charged particle detectors include a Faraday cup.

6. The system of claim 2, further comprising a control system configured to analyze the sensor signals and to adjust EUV generation parameters based, at least in part, on the sensor signals.

7. The system of claim 1, further comprising:
- a collector configured to receive extreme ultraviolet radiation from the plasma and to reflect the extreme ultraviolet radiation;
- one or more charged particle detectors, wherein:
- the scanner is configured to receive the extreme ultraviolet radiation reflected by the collector; and
- the one or more charged particle detectors are configured to generate sensor signals indicative of the charged particles detected within the scanner.

8. The system of claim 7, further comprising a control system configured to analyze the sensor signals and to adjust EUV generation parameters based, at least in part, on the sensor signals.

9. The system of claim 8, wherein the control system is configured to generate a model of the plasma based on the sensor signals and to analyze the model and to adjust the EUV generation parameters based on the model.

10. The system of claim 7, wherein the one or more-first charged particle detectors include an electron multiplying charge coupled device.

11. The system of claim 1, further comprising one or more light sensors and one or more lenses configured to direct extreme ultraviolet radiation toward the one or more light sensors.

12. A method, comprising:
- passing EUV light from an EUV generator to a scanner;
- performing a photolithography process on a wafer with the EUV light;
- deflecting, with a magnetic deflector in the scanner, charged particles from the EUV generator to an electromagnetic lens in a charged particle capture box in the scanner;

directing, with the electromagnetic lens, the charged particles onto a charged particle detector in the first charged particle capture box; and deflecting, into a second charged particle capture box with a second deflector downstream from the first deflector, second charged particles into a second charged particle capture box within the scanner.

13. The method of claim 12, further comprising sensing, with the charged particle detector the charged particles emitted from the EUV generator.

14. The method of claim 13, further comprising adjusting, with a control system, one or more EUV generation parameters based, at least in part, on characteristics of the charged particles sensed by the charged particle detector.

15. The method of claim 12, further comprising reflecting, with a collector in the EUV generator, EUV light toward the scanner.

16. A method, comprising:

generate EUV light by generating a plasma in an EUV generation chamber;

generate first sensor signals by sensing side-scatter light from the plasma;

generate second sensor signals by detecting charged particles from the plasma;

generate a 3D model of the plasma based on the first sensor signals and the second sensor signals; and adjust generation of the plasma based on the 3D model.

17. The method of claim 16, wherein generating the plasma includes:

outputting a stream of droplets from a droplet generator; and generating, in a plasma generation chamber, a plasma by irradiating the droplets with a laser.

18. The method of claim 17, wherein adjusting generation of the plasma includes adjusting one or more of:

a timing of the laser;

a pulse power of the laser;

a pulse profile of the laser;

a position of the laser.

19. The method of claim 17, wherein adjusting generation of the plasma includes adjusting one or more of:

a velocity of the droplets;

a size of the droplets;

an initial temperature of the droplets; and a trajectory of the droplets.

20. The method of claim 17, further comprising reflecting, with a collector mirror, the EUV light toward a scanner.

* * * * *